US012706578B2

(12) United States Patent
Apodaca

(10) Patent No.: US 12,706,578 B2
(45) Date of Patent: Aug. 11, 2026

(54) ZONE VOLUME CONTROL

(71) Applicant: Sonos, Inc., Santa Barbara, CA (US)

(72) Inventor: Eduardo Ahumada Apodaca, Santa Barbara, CA (US)

(73) Assignee: Sonos, Inc., Goleta, CA (US)

( * ) Notice: Subject to any disclaimer, the term of this patent is extended or adjusted under 35 U.S.C. 154(b) by 77 days.

(21) Appl. No.: 18/444,717

(22) Filed: Feb. 18, 2024

(65) Prior Publication Data

US 2024/0348222 A1 Oct. 17, 2024

Related U.S. Application Data

(63) Continuation of application No. 18/178,867, filed on Mar. 6, 2023, now Pat. No. 11,909,365, which is a (Continued)

(51) Int. Cl.
*H03G 3/02* (2006.01)
*G06F 3/0482* (2013.01)
(Continued)

(52) U.S. Cl.
CPC ............. *H03G 3/02* (2013.01); *G06F 3/0482* (2013.01); *G06F 3/0488* (2013.01); *G06F 3/165* (2013.01);
(Continued)

(58) Field of Classification Search
CPC ....... H03G 3/02; G06F 3/0482; G06F 3/0488; G06F 3/165; H04R 27/00; H04R 2227/005
See application file for complete search history.

(56) References Cited

U.S. PATENT DOCUMENTS 5,182,552 A 1/1993 Paynting
5,239,458 A 8/1993 Suzuki
(Continued)

FOREIGN PATENT DOCUMENTS

EP 1389853 A1 2/2004
EP 2341412 A1 * 7/2011 ........... G06F 1/1626
(Continued)

OTHER PUBLICATIONS

AudioTron Quick Start Guide, Version 1.0, Mar. 2001, 24 pages.
(Continued)

*Primary Examiner* — Yogeshkumar Patel
(74) *Attorney, Agent, or Firm* — Akerman LLP

(57) ABSTRACT

Example techniques involve controlling playback volumes. An example implementation includes displaying a group volume control of a synchrony group, the group volume control comprising a group volume indicator on a group volume slider and receiving, via the displayed group volume control, input data representing a selection of the group volume control. The implementation also includes displaying, concurrently with the group volume control, a first volume control comprising a first volume indicator on a first volume slider and a second volume control comprising a second volume indicator on a second volume slider. The implementation also includes receiving, via the displayed group volume control, input data representing an input to modify a first volume setting of the synchrony group to a second volume setting and transmitting instructions to cause the synchrony group to modify volume settings according to the second volume setting of the synchrony group.

20 Claims, 12 Drawing Sheets

Related U.S. Application Data continuation of application No. 17/120,634, filed on Dec. 14, 2020, now Pat. No. 11,601,104, which is a continuation of application No. 16/657,458, filed on Oct. 18, 2019, now Pat. No. 10,868,508, which is a continuation of application No. 16/176,095, filed on Oct. 31, 2018, now Pat. No. 10,454,437, which is a continuation of application No. 15/481,158, filed on Apr. 6, 2017, now Pat. No. 10,122,338, which is a continuation of application No. 13/913,222, filed on Jun. 7, 2013, now Pat. No. 9,654,073.

(51) Int. Cl.
*G06F 3/0488* (2022.01)
*G06F 3/16* (2006.01)
*H04R 27/00* (2006.01)

(52) U.S. Cl.
CPC ....... *H04R 27/00* (2013.01); *H04R 2227/005* (2013.01)

(56) References Cited

U.S. PATENT DOCUMENTS 5,299,266 A 3/1994 Lumsden
5,406,634 A 4/1995 Anderson et al.
5,440,644 A 8/1995 Farinelli et al.
5,751,819 A 5/1998 Dorrough
5,761,320 A 6/1998 Farinelli et al.
5,923,902 A 7/1999 Inagaki
6,026,150 A 2/2000 Frank et al.
6,032,202 A 2/2000 Lea et al.
6,256,554 B1 7/2001 DiLorenzo
6,404,811 B1 6/2002 Cvetko et al.
6,430,353 B1 8/2002 Honda et al.
6,469,633 B1 10/2002 Wachter
6,487,296 B1 11/2002 Allen et al.
6,522,886 B1 2/2003 Youngs et al.
6,611,537 B1 8/2003 Edens et al.
6,631,410 B1 10/2003 Kowalski et al.
6,728,531 B1 4/2004 Lee et al.
6,757,517 B2 6/2004 Chang
6,778,869 B2 8/2004 Champion
6,826,283 B1 11/2004 Wheeler et al.
6,891,955 B1 5/2005 Bowden et al.
7,130,608 B2 10/2006 Hollstrom et al.
7,130,616 B2 10/2006 Janik
7,143,939 B2 12/2006 Henzerling
7,218,708 B2 5/2007 Berezowski et al.
7,236,773 B2 6/2007 Thomas
7,295,548 B2 11/2007 Blank et al.
7,312,785 B2 12/2007 Tsuk et al.
7,391,791 B2 6/2008 Balassanian et al.
7,483,538 B2 1/2009 McCarty et al.
7,571,014 B1 8/2009 Lambourne et al.
7,630,501 B2 12/2009 Blank et al.
7,643,894 B2 1/2010 Braithwaite et al.
7,657,910 B1 2/2010 McAulay et al.
7,668,990 B2 2/2010 Krzyzanowski et al.
7,742,740 B2 6/2010 Goldberg et al.
7,853,341 B2 12/2010 McCarty et al.
7,987,294 B2 7/2011 Bryce et al.
8,014,423 B2 9/2011 Thaler et al.
8,045,952 B2 10/2011 Qureshey et al.
8,050,203 B2 11/2011 Jacobsen et al.
8,050,652 B2 11/2011 Qureshey et al.
8,103,009 B2 1/2012 McCarty et al.
8,131,390 B2 3/2012 Braithwaite et al.
8,234,395 B2 7/2012 Millington
8,290,603 B1 10/2012 Lambourne
8,346,236 B2 1/2013 Lai
8,434,006 B2 4/2013 Profitt
8,483,853 B1 7/2013 Lambourne
8,588,949 B2 11/2013 Lambourne et al.
8,942,252 B2 1/2015 Balassanian et al.
8,965,544 B2 2/2015 Ramsay
9,052,810 B2 6/2015 Reimann et al.
9,164,532 B2 10/2015 Millington
9,654,073 B2 5/2017 Apodaca
9,654,821 B2 5/2017 Coburn, IV et al.
9,680,433 B2 6/2017 Dizon et al.
9,785,399 B2 10/2017 Ramsay
10,133,536 B2 11/2018 Millington
2001/0042107 A1 11/2001 Palm
2002/0003548 A1 1/2002 Krusche et al.
2002/0022453 A1 2/2002 Balog et al.
2002/0026442 A1 2/2002 Lipscomb et al.
2002/0109710 A1 8/2002 Holtz et al.
2002/0124097 A1 9/2002 Isely et al.
2002/0165921 A1 11/2002 Sapieyevski
2002/0188762 A1 12/2002 Tomassetti et al.
2003/0020763 A1 1/2003 Mayer et al.
2003/0023741 A1 1/2003 Tomassetti et al.
2003/0157951 A1 8/2003 Hasty, Jr.
2003/0210796 A1 11/2003 McCarty et al.
2004/0008852 A1 1/2004 Also et al.
2004/0010727 A1 1/2004 Fujinami
2004/0015252 A1 1/2004 Aiso et al.
2004/0024478 A1 2/2004 Hans et al.
2004/0131192 A1 7/2004 Metcalf
2005/0047605 A1 3/2005 Lee et al.
2005/0289224 A1 12/2005 Deslippe et al.
2006/0210097 A1 9/2006 Yerrace et al.
2006/0251059 A1 11/2006 Otsu et al.
2007/0038999 A1 2/2007 Millington
2007/0129004 A1* 6/2007 Goldberg ............. G10H 1/0083 455/3.06
2007/0142022 A1 6/2007 Madonna et al.
2007/0142944 A1 6/2007 Goldberg et al.
2007/0232362 A1 10/2007 Kim et al.
2009/0228919 A1 9/2009 Zott et al.
2010/0185308 A1 7/2010 Yoshida et al.
2011/0051959 A1 3/2011 Ito et al.
2011/0243354 A2 10/2011 Mccarty et al.
2012/0051560 A1* 3/2012 Sanders ................... H03G 1/02 381/105
2012/0057725 A1 3/2012 Nakamura
2012/0096125 A1 4/2012 Kallai et al.
2012/0134512 A1 5/2012 Mashita et al.
2012/0242581 A1 9/2012 Laubach
2012/0263318 A1 10/2012 Millington et al.
2013/0014015 A1* 1/2013 Lambourne ......... G06F 3/04842 715/716
2013/0076651 A1 3/2013 Reimann et al.
2013/0080955 A1 3/2013 Reimann et al.
2013/0094667 A1 4/2013 Millington et al.
2013/0121510 A1* 5/2013 Yuasa ...................... H03G 3/02 381/109
2013/0241847 A1 9/2013 Shaffer et al.
2013/0283164 A1* 10/2013 Mahalingam ........... G06F 3/165 710/64
2014/0037107 A1 2/2014 Marino, Jr. et al.
2014/0093085 A1 4/2014 Jarvis et al.
2014/0363022 A1 12/2014 Dizon et al.
2016/0066189 A1 3/2016 Mahaffey et al.
2018/0048928 A1 2/2018 Arling et al.

FOREIGN PATENT DOCUMENTS

WO 200153994 7/2001
WO 2003093950 A2 11/2003
WO 2005013047 A2 2/2005

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.

(56) References Cited

OTHER PUBLICATIONS

Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Final Office Action mailed on Oct. 13, 2015, issued in connection with U.S. Appl. No. 13/913,222, filed Jun. 7, 2013, 14 pages.
Final Office Action mailed on Nov. 23, 2016, issued in connection with U.S. Appl. No. 13/913,222, filed Jun. 7, 2013, 15 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Motorola, "Simplefi, Wireless Digital Audio Receiver, Installation and User Guide," Dec. 31, 2001, 111 pages.
Non-Final Office Action mailed on May 6, 2015, issued in connection with U.S. Appl. No. 13/913,222, filed Jun. 7, 2013, 11 pages.
Non-Final Office Action mailed on May 16, 2016, issued in connection with U.S. Appl. No. 13/913,222, filed May 16, 2016, 12 pages.
Non-Final Office Action mailed on Apr. 20, 2020, issued in connection with U.S. Appl. No. 16/657,458, filed Oct. 18, 2019, 12 pages.
Non-Final Office Action mailed on Mar. 29, 2018, issued in connection with U.S. Appl. No. 15/481,158, filed Apr. 6, 2017, 14 pages.
Non-Final Office Action mailed on Apr. 6, 2022, issued in connection with U.S. Appl. No. 17/120,634, filed Dec. 14, 2020, 16 pages.
Notice of Allowance mailed on Aug. 17, 2020, issued in connection with U.S. Appl. No. 16/657,458, filed Oct. 18, 2019, 9 pages.
Notice of Allowance mailed on Oct. 18, 2023, issued in connection with U.S. Appl. No. 18/178,867, filed Mar. 6, 2023, 10 pages.
Notice of Allowance mailed on Sep. 25, 2018, issued in connection with U.S. Appl. No. 15/481,158, filed Apr. 6, 2017, 9 pages.
Notice of Allowance mailed on Jan. 26, 2017, issued in connection with U.S. Appl. No. 13/913,222, filed Jun. 7, 2013, 10 pages.
Notice of Allowance mailed on Jul. 26, 2019, issued in connection with U.S. Appl. No. 16/176,095, filed Oct. 31, 2018, 13 pages.
Notice of Allowance mailed on Oct. 27, 2022, issued in connection with U.S. Appl. No. 17/120,634, filed Dec. 14, 2020, 10 pages.
Palm, Inc., "Handbook for the Palm VII Handheld," May 2000, 311 pages.
Polycom Conference Composer User Guide, copyright 2001, 29 pages.
Presentations at WinHEC 2000, May 2000, 138 pages.
PRISMIQ, Inc., "PRISMIQ Media Player User Guide," 2003, 44 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 32 manual: copyright 2001.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

ZONE VOLUME CONTROL

CROSS REFERENCE TO RELATED APPLICATIONS

The present application is a continuation of U.S. application Ser. No. 18/178,867, titled "Zone Volume Control," filed Mar. 6, 2023, and currently pending; U.S. application Ser. No. 18/178,867 is a continuation of U.S. application Ser. No. 17/120,634 titled "Zone Volume Control," filed on Dec. 14, 2020, and issued on Mar. 7, 2023, as U.S. Pat. No. 11,601,104; U.S. application Ser. No. 17/120,634 is a continuation of U.S. application Ser. No. 16/657,458, titled "Zone Volume Control,' filed on Oct. 18, 2019, and issued on Dec. 15, 2020, as U.S. Pat. No. 10,868,508; U.S. application Ser. No. 16/657,458 is a continuation of U.S. application Ser. No. 16/176,095 titled "Zone Volume Control," filed Oct. 31, 2018, and issued on Oct. 22, 2019, as U.S. Pat. No. 10,454,437; U.S. application Ser. No. 16/176,095 is a continuation of U.S. application Ser. No. 15/481,158 titled "Group Volume Control," filed Apr. 6, 2017, and issued on Nov. 6, 2018, as U.S. Pat. No. 10,122,338; U.S. application Ser. No. 15/481,158 is a continuation of U.S. application Ser. No. 13/913,222 titled "Group Volume Control," filed Jun. 7, 2013, and issued on May 16, 2017, as U.S. Pat. No. 9,654,073. The entire contents of U.S. application Ser. Nos. 18/178,867; 17/120,634; 16/657,458; 16/176,095; 15/481,158; and 13/913,222 are incorporated herein by reference.

FIELD OF THE DISCLOSURE

The disclosure is related to consumer goods and, more particularly, to methods, systems, products, features, services, and other items directed to media playback or some aspect thereof.

BACKGROUND

Digital music has become readily available due in part to the development of consumer level technology that has allowed people to listen to digital music on a personal audio device. The consumer's increasing preference for digital audio has also resulted in the integration of personal audio devices into PDAs, cellular phones, and other mobile devices. The portability of these mobile devices has enabled people to take the music listening experience with them and outside of the home. People have become able to consume digital music, like digital music files or even Internet radio, in the home through the use of their computer or similar devices. Now there are many different ways to consume digital music, in addition to other digital content including digital video and photos, stimulated in many ways by high-speed Internet access at home, mobile broadband Internet access, and the consumer's hunger for digital media.

Until recently, options for accessing and listening to digital audio in an out-loud setting were severely limited. In 2005, Sonos offered for sale its first digital audio system that enabled people to, among many other things, access virtually unlimited sources of audio via one or more networked connected zone players, dynamically group or ungroup zone players upon command, wirelessly send the audio over a local network amongst zone players, and play the digital audio out loud in synchrony. The Sonos system can be controlled by software applications downloaded to certain network capable, mobile devices and computers.

Given the insatiable appetite of consumers towards digital media, there continues to be a need to develop consumer technology that revolutionizes the way people access and consume digital media.

BRIEF DESCRIPTION OF THE DRAWINGS

Features, aspects, and advantages of the presently disclosed technology may be better understood with regard to the following description, appended claims, and accompanying drawings where:

Figure 1:
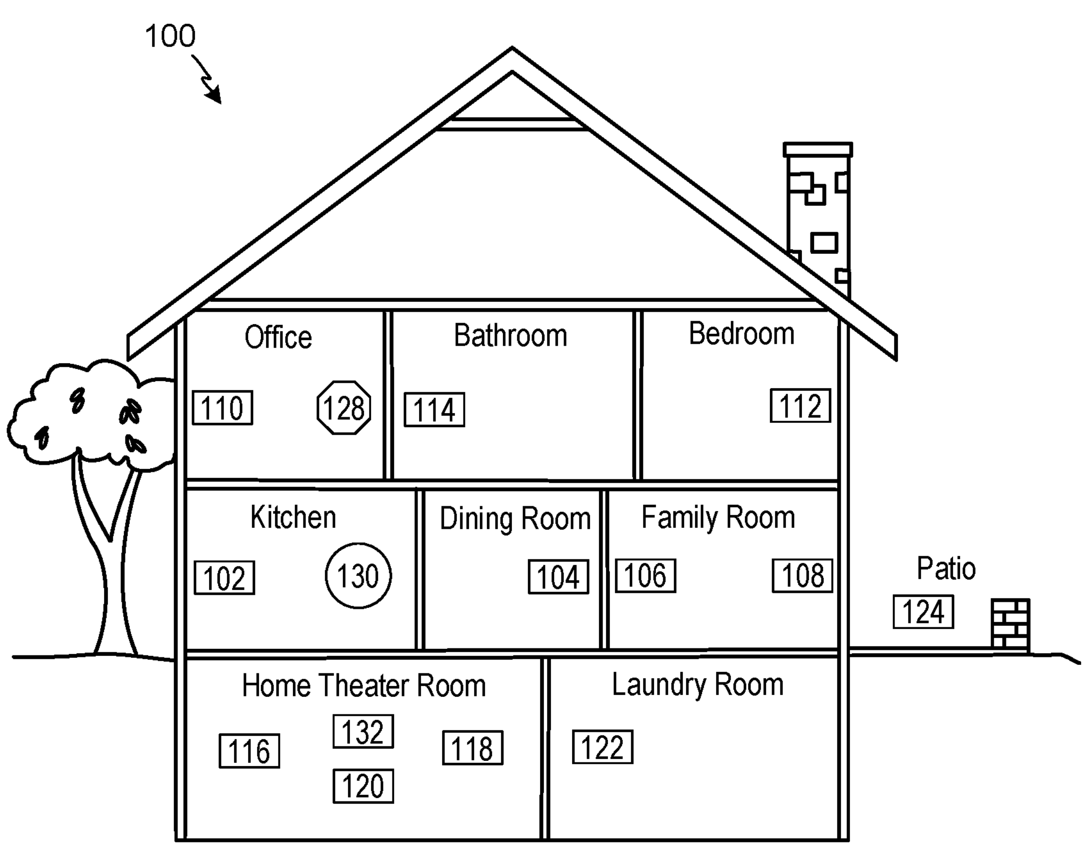
FIG. 1 shows an example configuration in which certain embodiments may be practiced.

In addition, the drawings are for the purpose of illustrating example embodiments, but it is understood that the inventions are not limited to the arrangements and instrumentality shown in the drawings.

DETAILED DESCRIPTION

I. Overview

Embodiments described herein involve volume controls of playback devices in a network media system. In one example, the network media system may include multiple playback zones, each having one or more playback devices and a respective, independently adjustable playback volume.

In one case, a group volume may be provided for a group of one or more playback zones in the network media system such that an adjustment of the group volume along a group volume scale may cause corresponding adjustments to playback volumes along respective volume scales for the one or more playback zones in the group. For instance, if an example "Porch" playback zone is playing media content at a volume level of 35 out of 100, and a group volume associated with a group including the Porch is adjusted by 19 increments from a volume level of 47 out of 100 to 66, the volume level of the Porch may accordingly be adjusted by 19 increments to be at 44.

In another case, the adjustment of the group volume may be applied to the one or more playback zones in the group such that the volume level on the respective volume scale for each playback zone in the group matches that of the group volume level on the group volume scale. In this case, the group volume level of 66 may be applied to the Porch and any other playback zone in the group such that the respective volume levels for the Porch and the other playback zones in the group may each be at 66 out of 100, matching the group volume level.

In one example, the playback volumes of playback devices in the network media system may be adjusted using a controller interface provided on a touch screen display of a network capable device. In one case, a particular playback volume may be graphically represented on the display as a volume indicator along a graphically represented volume scale, and a user may adjust the particular playback volume by touching the volume indicator displayed on the touch screen and dragging the volume indicator to a desired position along the volume scale. If the particular playback volume corresponds to a specific playback zone, the volume adjustment may be applied to the one or more playback devices in the specific playback zone. If the particular playback volume corresponds to a group of playback zones as discussed above, corresponding volume adjustments may be made to the one or more playback devices in each playback zone of the group.

Further, interactions between the user and user interface via the touch screen may be performed to cause the particular playback volume to be applied to other playback zones in the network media system, as also discussed above. In other words, the interactions may cause a corresponding volume indicator to be moved to the same, or substantially the same desired position along a corresponding volume scale for each playback zone the particular playback volume is to be applied to.

In one example, the interactions may include a dwell or hold touch input on the desired position along the volume scale. If the particular playback volume corresponds to a group of playback zones, the dwell or hold touch input may cause the desired playback volume or desired position along the volume scale to be applied to each playback zone in the group.

In another example, the interactions may include a swipe touch input. In one case, the swipe touch input may start at or substantially near the desired position along the volume scale for the particular volume level and traverse one or more playback volume representations shown on the controller interface. In this case, the desired playback volume or desired position along the volume scale may be applied to each playback zone associated with the one or more playback volume representations traversed by the swipe touch input. Other example interactions, such as flick or double tap input interactions are also possible.

As indicated above, the present application involves volume controls of playback devices in a network media system. In one aspect, a method is provided. The method involves providing for display on a user interface an adjustable first volume indicator along a first volume scale associated with a first playback volume of a first group of one or more playback devices, and an independently adjustable second volume indicator along a second volume scale associated with a second playback volume of a second group of one or more playback devices The method further involves receiving via the user interface, an input comprising one of (i) a continuous stationary touch engagement of a given duration with a particular input area on the user interface corresponding to a particular position of the first volume indicator along the first volume scale (ii) a continuous engagement beginning at a particular input area on the user interface substantially corresponding to a particular position of the first volume indicator along the first volume scale and traversing at least a second input area on the user interface corresponding to the second volume scale, and (iii) an engagement with a particular input area on the user interface substantially corresponding to a particular position of the first volume indicator along the first volume scale, and a directional disengagement from the particular input area towards at least a second input area on the user interface corresponding to the second volume scale.

The method also involves responsively, causing a corresponding movement of the second volume indicator to a matching position along the second volume scale according to the particular position of the first volume indicator, and causing the second playback volume of the second group of one or more playback devices to be adjusted to a new playback volume corresponding to the matching position along the second volume scale.

In another aspect, a device is provided. The device includes a processor and memory having stored thereon instructions executable by the processor to perform functions. The functions include providing for display on a user interface an adjustable first volume indicator along a first volume scale associated with a first playback volume of a first group of one or more playback devices, and an independently adjustable second volume indicator along a second volume scale associated with a second playback volume of a second group of one or more playback devices.

The functions further involve receiving via the user interface, an input comprising one of (i) a continuous stationary touch engagement of a given duration with a particular input area on the user interface corresponding to a particular position of the first volume indicator along the first volume scale (ii) a continuous engagement beginning at a particular input area on the user interface substantially corresponding to a particular position of the first volume indicator along the first volume scale and traversing at least a second input area on the user interface corresponding to the second volume scale, and (iii) an engagement with a particular input area on the user interface substantially corresponding to a particular position of the first volume indicator along the first volume scale, and a directional disengagement from the particular input area towards at least a second input area on the user interface corresponding to the second volume scale.

The functions also involve responsively, causing a corresponding movement of the second volume indicator to a matching position along the second volume scale according to the particular position of the first volume indicator, and causing the second playback volume of the second group of one or more playback devices to be adjusted to a new playback volume corresponding to the matching position along the second volume scale.

In yet another aspect, a non-transitory computer readable memory is provided. The non-transitory computer readable memory has stored thereon instructions executable by a computing device to cause the computing device to perform functions. The functions include providing for display on a user interface an adjustable first volume indicator along a first volume scale associated with a first playback volume of a first group of one or more playback devices, and an independently adjustable second volume indicator along a second volume scale associated with a second playback volume of a second group of one or more playback devices.

The functions further involve receiving via the user interface, an input comprising one of (i) a continuous stationary touch engagement of a given duration with a particular input area on the user interface corresponding to a particular position of the first volume indicator along the first volume scale (ii) a continuous engagement beginning at a particular input area on the user interface substantially corresponding to a particular position of the first volume indicator along the first volume scale and traversing at least a second input area on the user interface corresponding to the second volume scale, and (iii) an engagement with a particular input area on the user interface substantially corresponding to a particular position of the first volume indicator along the first volume scale, and a directional disengagement from the particular input area towards at least a second input area on the user interface corresponding to the second volume scale.

The functions also involve responsively, causing a corresponding movement of the second volume indicator to a matching position along the second volume scale according to the particular position of the first volume indicator, and causing the second playback volume of the second group of one or more playback devices to be adjusted to a new playback volume corresponding to the matching position along the second volume scale.

Other embodiments, as those discussed in the following and others as can be appreciated by one having ordinary skill in the art are also possible.

II. Example Operating Environment

Referring now to the drawings, in which like numerals can refer to like parts throughout the figures, FIG. 1 shows an example media system configuration 100 in which one or more embodiments disclosed herein can be practiced or implemented.

By way of illustration, the media system configuration 100 is associated with a home having multiple zones, although it should be understood that the home could be configured with only one zone. Additionally, one or more zones can be added to the configuration 100 over time. Each zone may be assigned by a user to a different room or space, such as, for example, an office, bathroom, bedroom, kitchen, dining room, family room, home theater room, utility or laundry room, and patio. A single zone might also include multiple rooms or spaces if so configured. With respect to FIG. 1, one or more of zone players 102-124 are shown in each respective zone. Zone players 102-124, also referred to herein as playback devices, multimedia units, speakers, players, and so on, provide audio, video, and/or audiovisual output. A controller 130 (e.g., shown in the kitchen for purposes of this illustration) provides control to the media system configuration 100. Controller 130 may be fixed to a zone, or alternatively, mobile such that it can be moved about the zones. The media system configuration 100 may also include more than one controller 130, and additional controllers may be added to the system over time.

The media system configuration 100 illustrates an example whole house media system, though it is understood that the technology described herein is not limited to, among other things, its particular place of application or to an expansive system like a whole house media system 100 of FIG. 1.

a. Example Zone Players

Figure 2A:
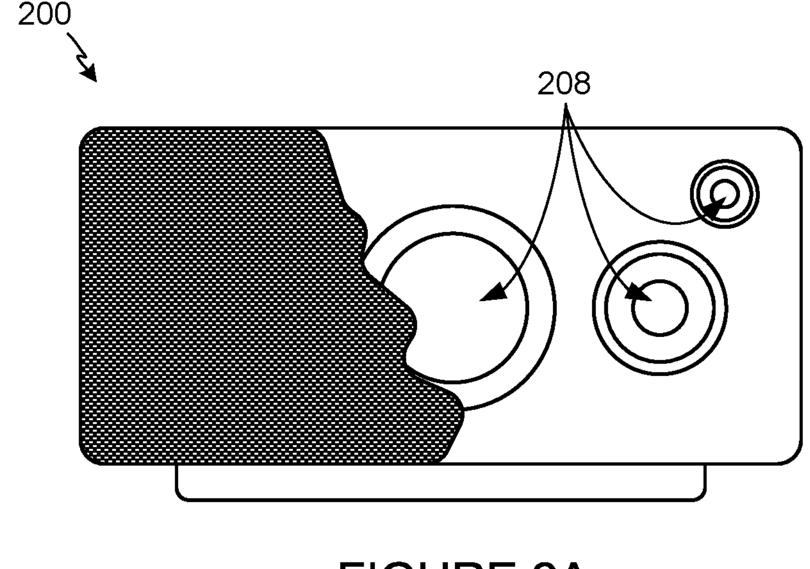
FIG. 2A shows an illustration of an example zone player having a built-in amplifier and transducers.
Figure 2B:
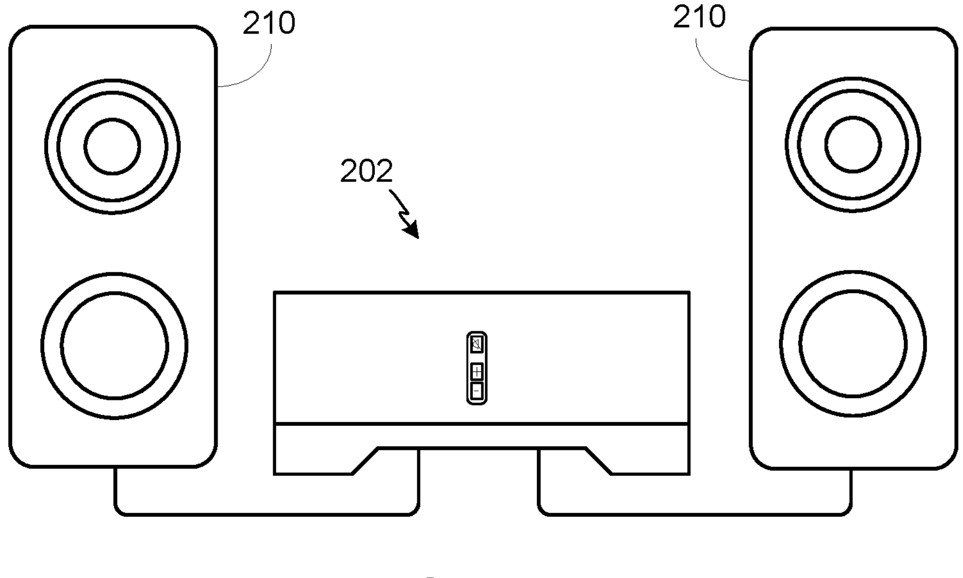
FIG. 2B shows an illustration of an example zone player having a built-in amplifier and connected to external speakers.
Figure 2C:
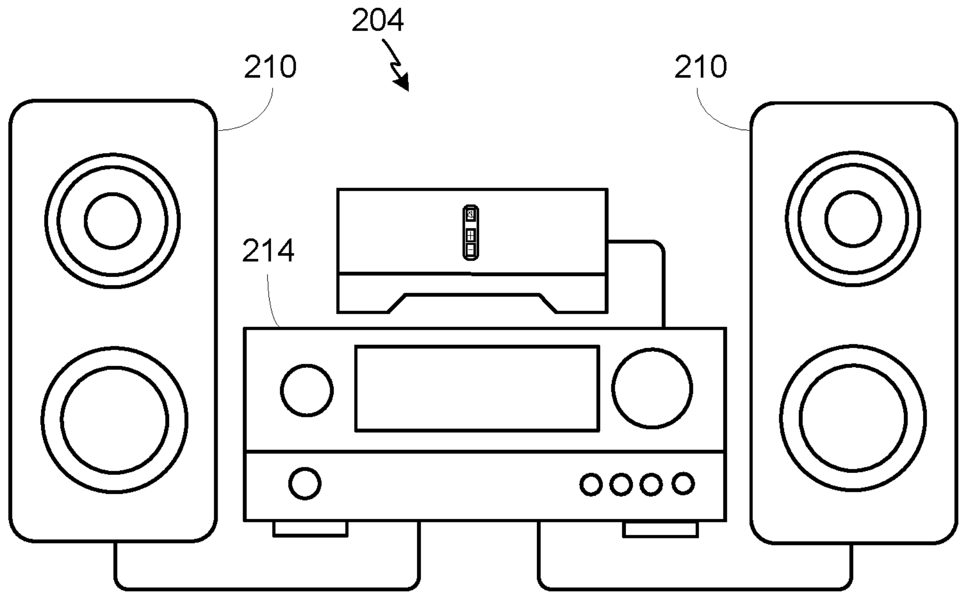
FIG. 2C shows an illustration of an example zone player connected to an A/V receiver and speakers.

FIGS. 2A, 2B, and 2C show example types of zone players. Zone players 200, 202, and 204 of FIGS. 2A, 2B, and 2C, respectively, can correspond to any of the zone players 102-124 of FIG. 1, for example. In some embodiments, audio is reproduced using only a single zone player, such as by a full-range player. In some embodiments, audio is reproduced using two or more zone players, such as by using a combination of full-range players or a combination of full-range and specialized players. In some embodiments, zone players 200-204 may also be referred to as a "smart speaker," because they contain processing capabilities beyond the reproduction of audio, more of which is described below.

FIG. 2A illustrates zone player 200 that includes sound producing equipment 208 capable of reproducing full-range sound. The sound may come from an audio signal that is received and processed by zone player 200 over a wired or wireless data network. Sound producing equipment 208 includes one or more built-in amplifiers and one or more acoustic transducers (e.g., speakers). A built-in amplifier is described more below with respect to FIG. 4. A speaker or acoustic transducer can include, for example, any of a tweeter, a mid-range driver, a low-range driver, and a subwoofer. In some embodiments, zone player 200 can be statically or dynamically configured to play stereophonic audio, monaural audio, or both. In some embodiments, zone player 200 may be dynamically configured to reproduce a subset of full-range sound, such as when zone player 200 is grouped with other zone players to play stereophonic audio, monaural audio, and/or surround audio or when the audio content received by zone player 200 is less than full-range.

FIG. 2B illustrates zone player 202 that includes a built-in amplifier to power a set of detached speakers 210. A detached speaker can include, for example, any type of loudspeaker. Zone player 202 may be configured to power one, two, or more separate loudspeakers. Zone player 202 may be configured to communicate an audio signal (e.g., right and left channel audio or more channels depending on its configuration) to the detached speakers 210 via a wired path.

FIG. 2C illustrates zone player 204 that does not include a built-in amplifier, but is configured to communicate an audio signal, received over a data network, to an audio (or "audio/video") receiver 214 with built-in amplification.

Referring back to FIG. 1, in some embodiments, one, some, or all of the zone players 102 to 124 can retrieve audio directly from a source. For example, a particular zone player in a zone or zone group may be assigned to a playback queue (or "queue"). The playback queue contains information corresponding to zero or more audio items for playback by the associated zone or zone group. The playback queue may be stored in memory on a zone player or some other designated device. Each item contained in the playback queue may comprise a uniform resource identifier (URI) or some other identifier that can be used by the zone player(s) to seek out and/or retrieve the audio items from the identified audio source(s). Depending on the item, the audio source might be found on the Internet (e.g., the cloud), locally from another device over the data network 128 (described further below), from the controller 130, stored on the zone player itself, or from an audio source communicating directly to the zone player. In some embodiments, the zone player can reproduce the audio itself (e.g., play the audio), send the audio to another zone player for reproduction, or both where the audio is reproduced by the zone player as well as one or more additional zone players (possibly in synchrony). In some embodiments, the zone player may play a first audio content (or alternatively, may not play the content at all), while sending a second, different audio content to another zone player(s) for reproduction. To the user, each item in a playback queue is represented on an interface of a controller by an element such as a track name, album name, playlist, or other some other representation. A user can populate the playback queue with audio items of interest. The user may also modify and clear the playback queue, if so desired.

By way of illustration, SONOS, Inc. of Santa Barbara, California presently offers for sale zone players referred to as a "PLAY:5," "PLAY:3," "PLAYBAR," "CONNECT: AMP," "CONNECT," and "SUB." Any other past, present, and/or future zone players can additionally or alternatively be used to implement the zone players of example embodiments disclosed herein. Additionally, it is understood that a zone player is not limited to the particular examples illustrated in FIGS. 2A, 2B, and 2C or to the SONOS product offerings. For example, a zone player may include a wired or wireless headphone. In yet another example, a zone player might include a sound bar for television. In yet another example, a zone player may include or interact with a docking station for an Apple IPOD™ or similar device.

b. Example Controllers

Figure 3:
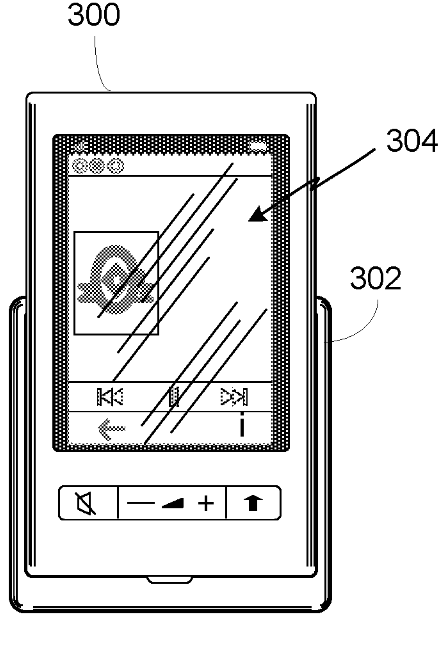
FIG. 3 shows an illustration of an example controller.

FIG. 3 illustrates an example wireless controller 300 in docking station 302. By way of illustration, controller 300 may correspond to controlling device 130 of FIG. 1. Docking station 302, if provided or used, may provide power to the controller 300 and additionally may charge a battery of controller 300. In some embodiments, controller 300 may be provided with a touch screen 304 that allows a user to interact through touch with the controller 300, for example, to retrieve and navigate a playlist of audio items, modify and/or clear the playback queue of one or more zone players, control other operations of one or more zone players, and provide overall control of the system configuration 100. In other embodiments, other input mechanisms such as voice control may be used to interact with the controller 300. In certain embodiments, any number of controllers can be used to control the system configuration 100. In some embodiments, there may be a limit set on the number of controllers that can control the system configuration 100. The controllers might be wireless like wireless controller 300 or wired to data network 128

In some embodiments, if more than one controller is used in system 100 of FIG. 1, each controller may be coordinated to display common content, and may all be dynamically updated to indicate changes made to the system 100 from a single controller. Coordination can occur, for instance, by a controller periodically requesting a state variable directly or indirectly from one or more of the zone players; the state variable may provide information about system 100, such as current zone group configuration, what is playing in one or more zones, volume levels, and other items of interest. The state variable may be passed around on data network 128 between zone players (and controllers, if so desired) as needed or as often as programmed.

In addition, an application running on any network-enabled portable device, such as an iPhone™, iPad™, Android™ powered phone or tablet, or any other smart phone or network-enabled device can be used as controller 130. An application running on a laptop or desktop personal computer (PC) or Mac™ can also be used as controller 130. Such controllers may connect to system 100 through an interface with data network 128, a zone player, a wireless router, or using some other configured connection path. Example controllers offered by Sonos, Inc. of Santa Barbara, California include a "Controller 200," "SONOS® CONTROL," "SONOS® Controller for iPhone™," "SONOS® Controller for iPad™," "SONOS® Controller forAndroid™," "SONOS® Controller for Mac™ or PC."

c. Example Data Connection

Zone players 102 to 124 of FIG. 1 are coupled directly or indirectly to a data network, such as data network 128. Controller 130 may also be coupled directly or indirectly to data network 128 or individual zone players. Data network 128 is represented by an octagon in the figure to stand out from other representative components. While data network 128 is shown in a single location, it is understood that such a network is distributed in and around system 100. Particularly, data network 128 can be a wired network, a wireless network, or a combination of both wired and wireless networks. In some embodiments, one or more of the zone players 102-124 are wirelessly coupled to data network 128 based on a proprietary mesh network. In some embodiments, one or more of the zone players are coupled to data network 128 using a centralized access point such as a wired or wireless router. In some embodiments, one or more of the zone players 102-124 are coupled via a wire to data network 128 using Ethernet or similar technology. In addition to the one or more zone players 102-124 connecting to data network 128, data network 128 can further allow access to a wide area network, such as the Internet.

In some embodiments, connecting any of the zone players 102-124, or some other connecting device, to a broadband router, can create data network 128. Other zone players 102-124 can then be added wired or wirelessly to the data network 128. For example, a zone player (e.g., any of zone players 102-124) can be added to the system configuration 100 by simply pressing a button on the zone player itself (or perform some other action), which enables a connection to be made to data network 128. The broadband router can be connected to an Internet Service Provider (ISP), for example. The broadband router can be used to form another data network within the system configuration 100, which can be used in other applications (e.g., web surfing). Data network 128 can also be used in other applications, if so programmed. An example, second network may implement SONOSNET™ protocol, developed by SONOS, Inc. of Santa Barbara. SONOSNET™ represents a secure, AES-encrypted, peer-to-peer wireless mesh network. Alternatively, in certain embodiments, the data network 128 is the same network, such as a traditional wired or wireless network, used for other applications in the household.

d. Example Zone Configurations

A particular zone can contain one or more zone players. For example, the family room of FIG. 1 contains two zone players 106 and 108, while the kitchen is shown with one zone player 102. In another example, the home theater room contains additional zone players to play audio from a 5.1 channel or greater audio source (e.g., a movie encoded with 5.1 or greater audio channels). In some embodiments, one can position a zone player in a room or space and assign the zone player to a new or existing zone via controller 130. As such, zones may be created, combined with another zone, removed, and given a specific name (e.g., "Kitchen"), if so desired and programmed to do so with controller 130. Moreover, in some embodiments, zone configurations may be dynamically changed even after being configured using controller 130 or some other mechanism.

In some embodiments, if a zone contains two or more zone players, such as the two zone players 106 and 108 in the family room, then the two zone players 106 and 108 can be configured to play the same audio source in synchrony, or the two zone players 106 and 108 can be paired to play two separate sounds in left and right channels, for example. In other words, the stereo effects of a sound can be reproduced or enhanced through the two zone players 106 and 108, one for the left sound and the other for the right sound. In certain embodiments, paired zone players (also referred to as "bonded zone players") can play audio in synchrony with other zone players in the same or different zones.

In some embodiments, two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player will have additional speaker drivers from which sound can be passed. The consolidated zone player can further be paired with a single zone player or yet another consolidated zone player. Each playback device of a consolidated playback device can be set in a consolidated mode, for example.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

e. Example Audio Sources

In some embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly (or substantially seamlessly) listening to the audio. Further, zones can be put into a "party mode" such that all associated zones will play audio in synchrony.

Sources of audio content to be played by zone players 102-124 are numerous. In some embodiments, audio on a zone player itself may be accessed and played. In some embodiments, audio on a controller may be accessed via the data network 128 and played. In some embodiments, music from a personal library stored on a computer or networked-attached storage (NAS) may be accessed via the data network 128 and played. In some embodiments, Internet radio stations, shows, and podcasts may be accessed via the data network 128 and played. Music or cloud services that let a user stream and/or download music and audio content may be accessed via the data network 128 and played. Further, music may be obtained from traditional sources, such as a turntable or CD player, via a line-in connection to a zone player, for example. Audio content may also be accessed using a different protocol, such as AIRPLAY™, which is a wireless technology by Apple, Inc., for example. Audio content received from one or more sources can be shared amongst the zone players 102 to 124 via data network 128 and/or controller 130. The above-disclosed sources of audio content are referred to herein as network-based audio information sources. However, network-based audio information sources are not limited thereto.

In some embodiments, the example home theater zone players 116, 118, 120 are coupled to an audio information source such as a television 132. In some examples, the television 132 is used as a source of audio for the home theater zone players 116, 118, 120, while in other examples audio information from the television 132 may be shared with any of the zone players 102-124 in the audio system 100.

III. Example Zone Players

Figure 4:
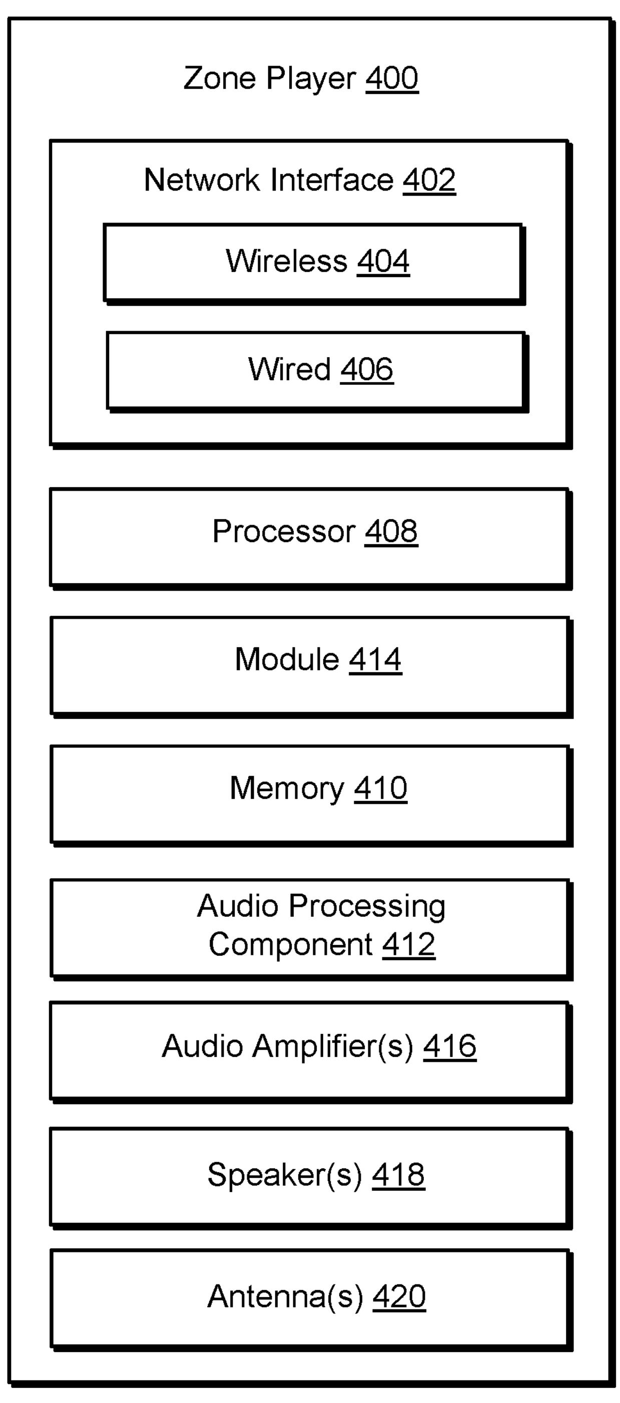
FIG. 4 shows an internal functional block diagram of an example zone player.

Referring now to FIG. 4, there is shown an example block diagram of a zone player 400 in accordance with an embodiment. Zone player 400 includes a network interface 402, a processor 408, a memory 410, an audio processing component 412, one or more modules 414, an audio amplifier 416, and a speaker unit 418 coupled to the audio amplifier 416. FIG. 2A shows an example illustration of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a television, lighting, or some other device for indoor or outdoor use.

In some embodiments, network interface 402 facilitates a data flow between zone player 400 and other devices on a data network 128. In some embodiments, in addition to getting audio from another zone player or device on data network 128, zone player 400 may access audio directly from the audio source, such as over a wide area network or on the local network. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address.

In some embodiments, network interface 402 can include one or both of a wireless interface 404 and a wired interface 406. The wireless interface 404, also referred to as a radio frequency (RF) interface, provides network interface functions for the zone player 400 to wirelessly communicate with other devices (e.g., other zone player(s), speaker(s), receiver(s), component(s) associated with the data network 128, and so on) in accordance with a communication protocol (e.g., any wireless standard including IEEE 802.11a, 802.11b, 802.11g, 802.11n, 802.11ac, 802.15, 4G mobile communication standard, and so on). Wireless interface 404 may include one or more radios. To receive wireless signals and to provide the wireless signals to the wireless interface 404 and to transmit wireless signals, the zone player 400 includes one or more antennas 420. The wired interface 406 provides network interface functions for the zone player 400 to communicate over a wire with other devices in accordance with a communication protocol (e.g., IEEE 802.3). In some embodiments, a zone player includes multiple wireless 404 interfaces. In some embodiments, a zone player includes multiple wired 406 interfaces. In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software module(s) 414, which can be executed by the processor 408 to achieve certain tasks. In the illustrated embodiment, the memory 410 is a tangible machine-readable medium storing instructions that can be executed by the processor 408. In some embodiments, a task might be for the zone player 400 to retrieve audio data from another zone player or a device on a network (e.g., using a uniform resource locator (URL) or some other identifier). In some embodiments, a task may be for the zone player 400 to send audio data to another zone player or device on a network. In some embodiments, a task may be for the zone player 400 to synchronize playback of audio with one or more additional zone players. In some embodiments, a task may be to pair the zone player 400 with one or more zone players to create a multi-channel audio environment. Additional or alternative tasks can be achieved via the one or more software module(s) 414 and the processor 408.

The audio processing component 412 can include one or more digital-to-analog converters (DAC), an audio preprocessing component, an audio enhancement component or a digital signal processor, and so on. In some embodiments, the audio processing component 412 may be part of processor 408. In some embodiments, the audio that is retrieved via the network interface 402 is processed and/or intentionally altered by the audio processing component 412. Further, the audio processing component 412 can produce analog audio signals. The processed analog audio signals are then provided to the audio amplifier 416 for playback through speakers 418. In addition, the audio processing component 412 can include circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device(s) that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (e.g., for low frequencies), a mid-range driver (e.g., for middle frequencies), and a tweeter (e.g., for high frequencies), for example. An enclosure can be sealed or ported, for example. Each transducer may be driven by its own individual amplifier.

A commercial example, presently known as the PLAY:5™, is a zone player with a built-in amplifier and speakers that is capable of retrieving audio directly from the source, such as on the Internet or on the local network, for example. In particular, the PLAY:5™ is a five-amp, five-driver speaker system that includes two tweeters, two mid-range drivers, and one woofer. When playing audio content via the PLAY:5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies but from different channels of audio. Audio from Internet radio stations, online music and video services, downloaded music, analog audio inputs, television, DVD, and so on, can be played from the PLAY:5™.

IV. Example Controller

Figure 5:
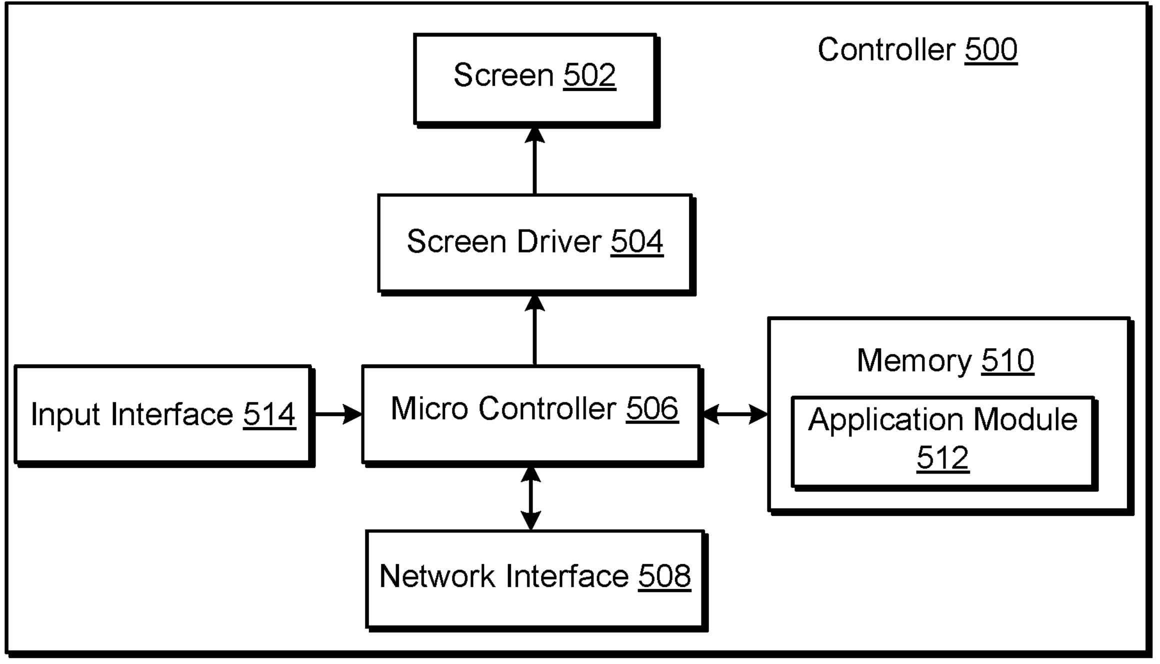
FIG. 5 shows an internal functional block diagram of an example controller.

Referring now to FIG. 5, there is shown an example block diagram for controller 500, which can correspond to the controlling device 130 in FIG. 1. Controller 500 can be used to facilitate the control of multi-media applications, automation and others in a system. In particular, the controller 500 may be configured to facilitate a selection of a plurality of audio sources available on the network and enable control of one or more zone players (e.g., the zone players 102-124 in FIG. 1) through a wireless or wired network interface 508. According to one embodiment, the wireless communications is based on an industry standard (e.g., infrared, radio, wireless standards including IEEE 802.11a, 802.11b, 802.11g, 802.11n, 802.15, 4G mobile communication standard, and so on). Further, when a particular audio is being accessed via the controller 500 or being played via a zone player, a picture (e.g., album art) or any other data, associated with the audio and/or audio source can be transmitted from a zone player or other electronic device to controller 500 for display.

Controller 500 is provided with a screen 502 and an input interface 514 that allows a user to interact with the controller 500, for example, to navigate a playlist of many multimedia items and to control operations of one or more zone players. The screen 502 on the controller 500 can be an LCD screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group to facilitate synchronized playback amongst the zone players in the zone group. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wired or wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system, and each controller may share common information with another controller, or retrieve the common information from a zone player, if such a zone player stores configuration data (e.g., such as a state variable). Further, a controller can be integrated into a zone player.

It should be noted that other network-enabled devices such as an IPHONE™, IPAD™ or any other smart phone or network-enabled device (e.g., a networked computer such as a PC or MAC™) can also be used as a controller to interact or control zone players in a particular environment. In some embodiments, a software application or upgrade can be downloaded onto a network-enabled device to perform the functions described herein.

In certain embodiments, a user can create a zone group (also referred to as a bonded zone) including at least two zone players from the controller 500. The zone players in the zone group can play audio in a synchronized fashion, such that all of the zone players in the zone group playback an identical audio source or a list of identical audio sources in a synchronized manner such that no (or substantially no) audible delays or hiccups are to be heard. Similarly, in some embodiments, when a user increases the audio volume of the group from the controller 500, the signals or data of increasing the audio volume for the group are sent to one of the zone players and causes other zone players in the group to be increased together in volume.

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio playback is to link a number of zone players together to form a group. To link a number of zone players together, a user can manually link each zone player or room one after the other. For example, assume that there is a multi-zone system that includes the following zones: Bathroom, Bedroom, Den, Dining Room, Family Room, and Foyer. In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would manually and individually link each zone. The single command may include a mouse click, a double mouse click, a button press, a gesture, or some other programmed or learned action. Other kinds of zone scenes can be programmed or learned by the system over time.

In certain embodiments, a zone scene can be triggered based on time (e.g., an alarm clock function). For instance, a zone scene can be set to apply at 8:00 am. The system can link appropriate zones automatically, set specific music to play, and then stop the music after a defined duration and revert the zones to their prior configuration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer can be programmed to sound. The buzzer can include a sound file that is stored in a zone player, for example.

V. Playback Queue

As discussed above, in some embodiments, a zone player may be assigned to a playback queue identifying zero or more media items for playback by the zone player. The media items identified in a playback queue may be represented to the user via an interface on a controller. For instance, the representation may show the user (or users if more than one controller is connected to the system) how the zone player is traversing the playback queue, such as by highlighting the "now playing" item, graying out the previously played item(s), highlighting the to-be-played item(s), and so on.

In some embodiments, a single zone player is assigned to a playback queue. For example, zone player 114 in the bathroom of FIG. 1 may be linked or assigned to a "Bathroom" playback queue. In an embodiment, the "Bathroom" playback queue might have been established by the system as a result of the user naming the zone player 114 to the bathroom. As such, contents populated and identified in the "Bathroom" playback queue can be played via the zone player 114 (the bathroom zone).

In some embodiments, a zone or zone group is assigned to a playback queue. For example, zone players 106 and 108 in the family room of FIG. 1 may be linked or assigned to a "Family room" playback queue. In another example, if family room and dining room zones were grouped, then the new group would be linked or assigned to a family room+dining room playback queue. In some embodiments, the family room+dining room playback queue would be established based upon the creation of the group. In some embodiments, upon establishment of the new group, the family room+dining room playback queue can automatically include the contents of one (or both) of the playback queues associated with either the family room or dining room or both. In one instance, if the user started with the family room and added the dining room, then the contents of the family room playback queue would become the contents of the family room+dining room playback queue. In another instance, if the user started with the family room and added the dining room, then the family room playback queue would be renamed to the family room+dining room playback queue. If the new group was "ungrouped," then the family room+dining room playback queue may be removed from the system and/or renamed to one of the zones (e.g., renamed to "family room" or "dining room"). After ungrouping, each of the family room and the dining room will be assigned to a separate playback queue. One or more of the zone players in the zone or zone group may store in memory the associated playback queue.

As such, when zones or zone groups are "grouped" or "ungrouped" dynamically by the user via a controller, the system will, in some embodiments, establish or remove/rename playback queues respectively, as each zone or zone group is to be assigned to a playback queue. In other words, the playback queue operates as a container that can be populated with media items for playback by the assigned zone. In some embodiments, the media items identified in a playback queue can be manipulated (e.g., re-arranged, added to, deleted from, and so on).

Figure 6:
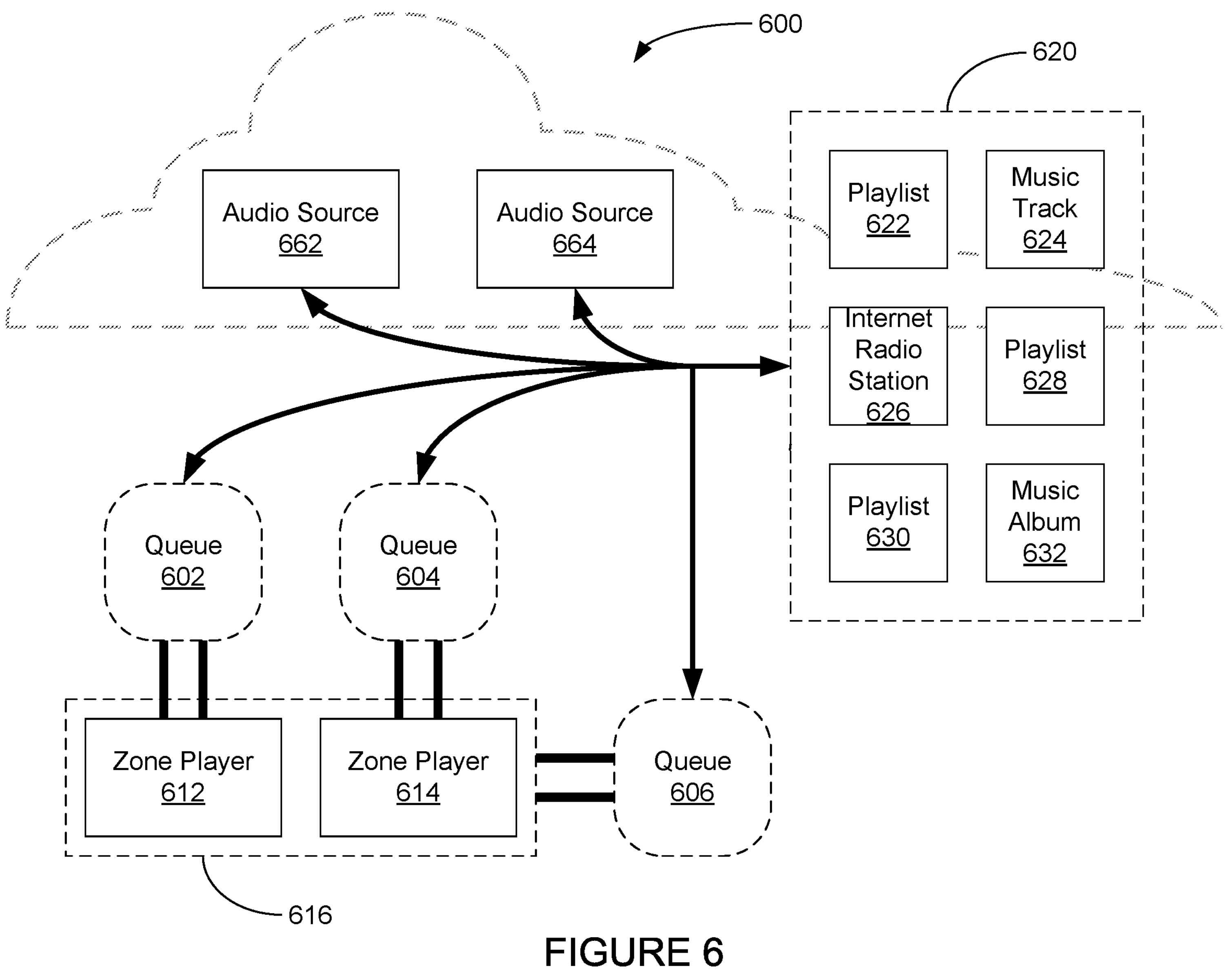
FIG. 6 shows an example playback queue configuration for a network media system.

By way of illustration, FIG. 6 shows an example network 600 for media content playback. As shown, the example network 600 includes example zone players 612 and 614, example audio sources 662 and 664, and example media items 620. The example media items 620 may include playlist 622, music track 624, favorite Internet radio station 626, playlists 628 and 630, and album 632. In one embodiment, the zone players 612 and 614 may be any of the zone players shown in FIGS. 1, 2, and 4. For instance, zone players 612 and 614 may be the zone players 106 and 108 in the Family Room.

In one example, the example audio sources 662 and 664, and example media items 620 may be partially stored on a cloud network, discussed more below in connection to FIG. 8. In some cases, the portions of the audio sources 662, 664, and example media items 620 may be stored locally on one or both of the zone players 612 and 614. In one embodiment, playlist 622, favorite Internet radio station 626, and playlist 630 may be stored locally, and music track 624, playlist 628, and album 632 may be stored on the cloud network.

Each of the example media items 620 may be a list of media items playable by a zone player(s). In one embodiment, the example media items may be a collection of links or pointers (i.e. URI) to the underlying data for media items that are stored elsewhere, such as the audio sources 662 and 664. In another embodiment, the media items may include pointers to media content stored on the local zone player, another zone player over a local network, or a controller device connected to the local network.

As shown, the example network 600 may also include an example queue 602 associated with the zone player 612, and an example queue 604 associated with the zone player 614. Queue 606 may be associated with a group, when in existence, comprising zone players 612 and 614. Queue 606 might comprise a new queue or exist as a renamed version of queue 602 or 604. In some embodiments, in a group, the zone players 612 and 614 would be assigned to queue 606 and queue 602 and 604 would not be available at that time. In some embodiments, when the group is no longer in existence, queue 606 is no longer available. Each zone player and each combination of zone players in a network of zone players, such as those shown in FIG. 1 or that of example zone players 612, 614, and example combination 616, may be uniquely assigned to a corresponding playback queue.

A playback queue, such as playback queues 602-606, may include identification of media content to be played by the corresponding zone player or combination of zone players. As such, media items added to the playback queue are to be played by the corresponding zone player or combination of zone players. The zone player may be configured to play items in the queue according to a specific order (such as an order in which the items were added), in a random order, or in some other order.

The playback queue may include a combination of playlists and other media items added to the queue. In one embodiment, the items in playback queue 602 to be played by the zone player 612 may include items from the audio sources 662, 664, or any of the media items 622-632. The playback queue 602 may also include items stored locally on the zone player 612, or items accessible from the zone player 614. For instance, the playback queue 602 may include Internet radio 626 and album 632 items from audio source 662, and items stored on the zone player 612.

When a media item is added to the queue via an interface of a controller, a link to the item may be added to the queue. In a case of adding a playlist to the queue, links to the media items in the playlist may be provided to the queue. For example, the playback queue 602 may include pointers from the Internet radio 626 and album 632, pointers to items on the audio source 662, and pointers to items on the zone player 612. In another case, a link to the playlist, for example, rather than a link to the media items in the playlist may be provided to the queue, and the zone player or combination of zone players may play the media items in the playlist by accessing the media items via the playlist. For example, the album 632 may include pointers to items stored on audio source 662. Rather than adding links to the items on audio source 662, a link to the album 632 may be added to the playback queue 602, such that the zone player 612 may play the items on the audio source 662 by accessing the items via pointers in the album 632.

In some cases, contents as they exist at a point in time within a playback queue may be stored as a playlist, and subsequently added to the same queue later or added to another queue. For example, contents of the playback queue 602, at a particular point in time, may be saved as a playlist, stored locally on the zone player 612 and/or on the cloud network. The saved playlist may then be added to playback queue 604 to be played by zone player 614.

VI. Example Ad-Hoc Network

Figure 7:
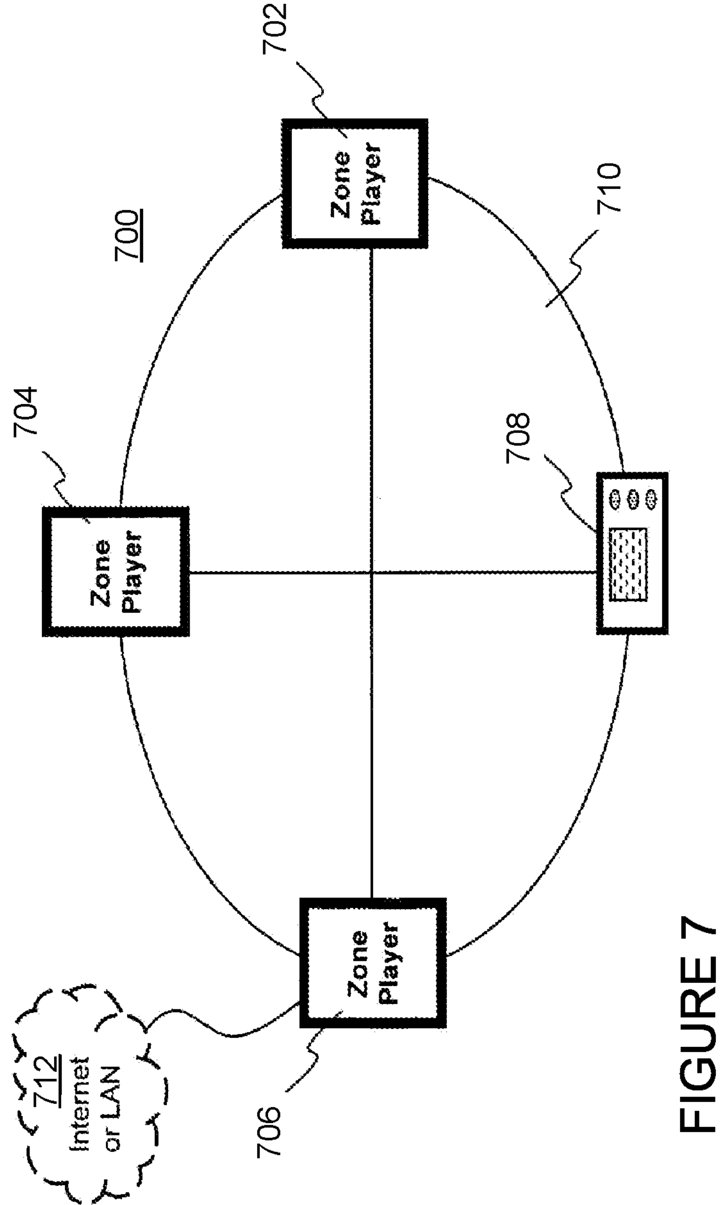
FIG. 7 shows an example ad-hoc playback network.

Particular examples are now provided in connection with FIG. 7 to describe, for purposes of illustration, certain embodiments to provide and facilitate connection to a playback network. FIG. 7 shows that there are three zone players 702, 704 and 706 and a controller 708 that form a network branch that is also referred to as an Ad-Hoc network 710. The network 710 may be wireless, wired, or a combination of wired and wireless technologies. In general, an Ad-Hoc (or "spontaneous") network is a local area network or other small network in which there is generally no one access point for all traffic. With an established Ad-Hoc network 710, the devices 702, 704, 706 and 708 can all communicate with each other in a "peer-to-peer" style of communication, for example. Furthermore, devices may join and/or leave from the network 710, and the network 710 will automatically reconfigure itself without needing the user to reconfigure the network 710. While an Ad-Hoc network is referenced in FIG. 7, it is understood that a playback network may be based on a type of network that is completely or partially different from an Ad-Hoc network.

Using the Ad-Hoc network 710, the devices 702, 704, 706, and 708 can share or exchange one or more audio sources and be dynamically grouped (or ungrouped) to play the same or different audio sources. For example, the devices 702 and 704 are grouped to playback one piece of music, and at the same time, the device 706 plays back another piece of music. In other words, the devices 702, 704, 706 and 708, as shown in FIG. 7, form a HOUSEHOLD that distributes audio and/or reproduces sound. As used herein, the term HOUSEHOLD (provided in uppercase letters to disambiguate from the user's domicile) is used to represent a collection of networked devices that are cooperating to provide an application or service. An instance of a HOUSEHOLD is identified with a household 710 (or household identifier), though a HOUSEHOLD may be identified with a different area or place.

In certain embodiments, a household identifier (HHID) is a short string or an identifier that is computer-generated to help ensure that it is unique. Accordingly, the network 710 can be characterized by a unique HHID and a unique set of configuration variables or parameters, such as channels (e.g., respective frequency bands), service set identifier (SSID) (a sequence of alphanumeric characters as a name of a wireless network), and WEP keys (wired equivalent privacy) or other security keys. In certain embodiments, SSID is set to be the same as HHID.

In certain embodiments, each HOUSEHOLD includes two types of network nodes: a control point (CP) and a zone player (ZP). The control point controls an overall network setup process and sequencing, including an automatic generation of required network parameters (e.g., security keys). In an embodiment, the CP also provides the user with a HOUSEHOLD configuration user interface. The CP function can be provided by a computer running a CP application module, or by a handheld controller (e.g., the controller 308) also running a CP application module, for example. The zone player is any other device on the network that is placed to participate in the automatic configuration process. The ZP, as a notation used herein, includes the controller 308 or a computing device, for example. In some embodiments, the functionality, or certain parts of the functionality, in both the CP and the ZP are combined at a single node (e.g., a ZP contains a CP or vice-versa).

In certain embodiments, configuration of a HOUSEHOLD involves multiple CPs and ZPs that rendezvous and establish a known configuration such that they can use a standard networking protocol (e.g., IP over Wired or Wireless Ethernet) for communication. In an embodiment, two types of networks/protocols are employed: Ethernet 802.3 and Wireless 802.11g. Interconnections between a CP and a ZP can use either of the networks/protocols. A device in the system as a member of a HOUSEHOLD can connect to both networks simultaneously.

In an environment that has both networks in use, it is assumed that at least one device in a system is connected to both as a bridging device, thus providing bridging services between wired/wireless networks for others. The zone player 706 in FIG. 7 is shown to be connected to both networks, for example. The connectivity to the network 712 is based on Ethernet and/or Wireless, while the connectivity to other devices 702, 704 and 708 is based on Wireless and Ethernet if so desired.

It is understood, however, that in some embodiments each zone player 706, 704, 702 may access the Internet when retrieving media from the cloud (e.g., the Internet) via the bridging device. For example, zone player 702 may contain a uniform resource locator (URL) that specifies an address to a particular audio track in the cloud. Using the URL, the zone player 702 may retrieve the audio track from the cloud, and ultimately play the audio out of one or more zone players.

VII. Another Example System Configuration

Figure 8:
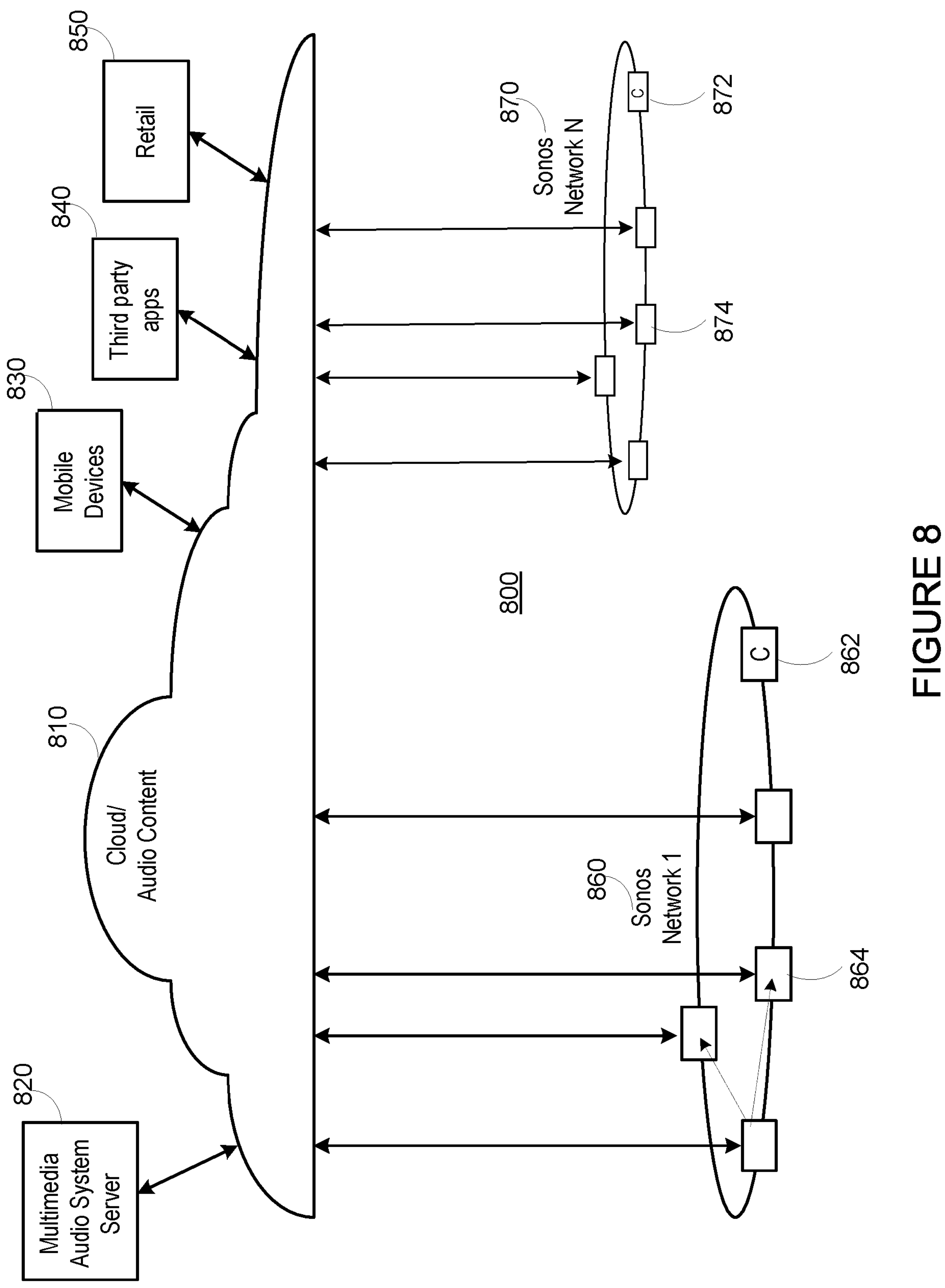
FIG. 8 shows a system including a plurality of networks including a cloud-based network and at least one local playback network.

FIG. 8 shows a system 800 including a plurality of interconnected networks including a cloud-based network and at least one local playback network. A local playback network includes a plurality of playback devices or players, though it is understood that the playback network may contain only one playback device. In certain embodiments, each player has an ability to retrieve its content for playback. Control and content retrieval can be distributed or centralized, for example. Input can include streaming content provider input, third party application input, mobile device input, user input, and/or other playback network input into the cloud for local distribution and playback.

As illustrated by the example system 800 of FIG. 8, a plurality of content providers 820-850 can be connected to one or more local playback networks 860-870 via a cloud and/or other network 810. Using the cloud 810, a multimedia audio system server 820 (e.g., Sonos™), a mobile device 830, a third party application 840, a content provider 850 and so on can provide multimedia content (requested or otherwise) to local playback networks 860, 870. Within each local playback network 860, 870, a controller 862, 872 and a playback device 864, 874 can be used to playback audio content.

VIII. Example Group Volume Control in a Network Media System

As discussed above, embodiments described herein involve volume controls of playback devices in a network media system. In one example, the playback devices may include zone players by SONOS, Inc., as identified previously. In one case, one or more of the playback devices may be organized into playback zones to render media content in synchrony, as described above. In another case, one or more of the playback zones may further be organized into one or more groups of playback zones.

In one example, the interface may be provided on the controller 130 as discussed above, in the form of an application running on a network-enabled device. In one case, the first controller interface may be an application associated with the network media system, such as a controller application for SONOS zone players. The interface may be accessible by a user to manage and control a network media system, which may include one or more playback zones, each including one or more playback devices. In one example, the device providing the user interface may include a touch-sensitive screen interface, such that the user may manage and control the network media system through touch inputs on the interface.

Touch inputs on the interface may include a land input indicating a touch engagement with the user interface, a swipe input indicating continuous engagement between two input areas on the user interface, a lift input indicating a touch disengagement from the user interface, a flick input indicating a directional disengagement from the user interface, and a hold input indicating a stationary touch engagement of a given duration with the user interface. Interactions with the interface may include a series of the suggested touch inputs performed discreetly or continuously. Other example touch inputs and interactions with the interface may also be possible.

Figure 10B:
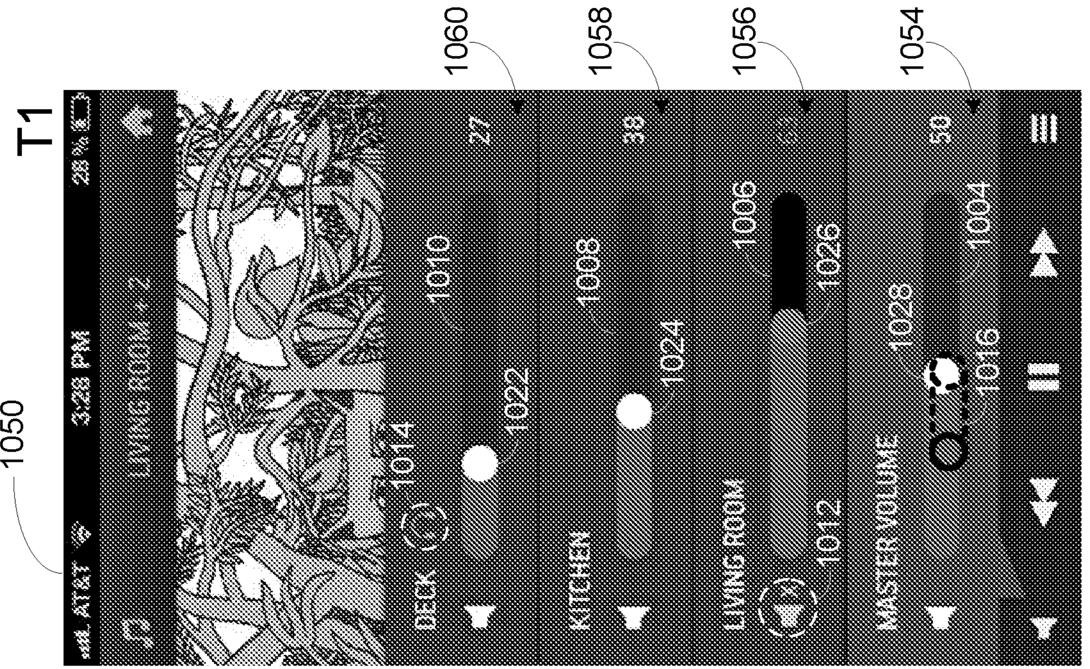
FIG. 10B shows an example representation of a first example interface for volume control of a group of playback devices.
Figure 10B:
Figure 10A:
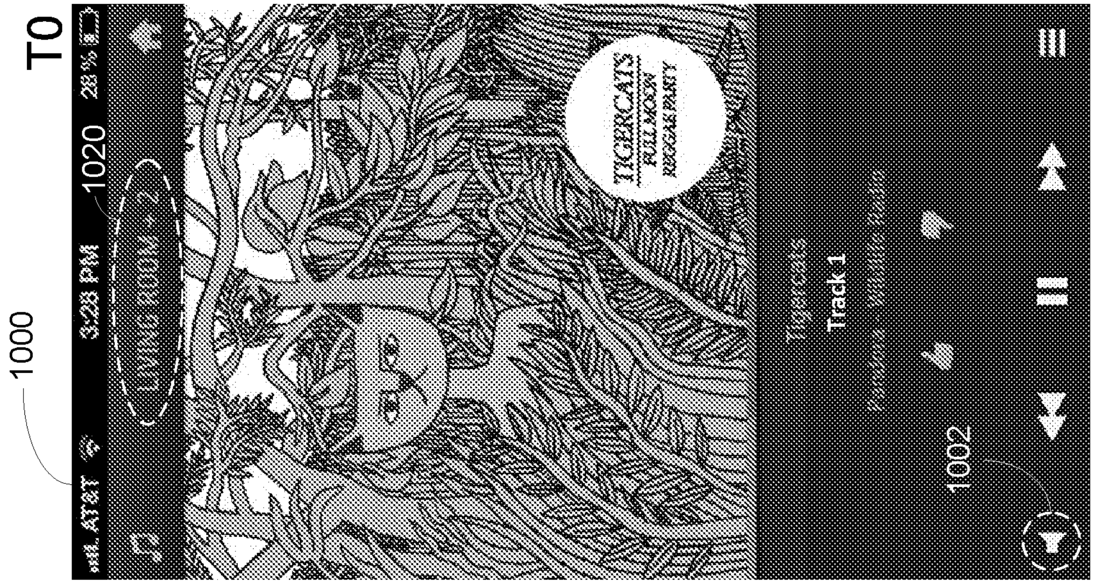
FIG. 10A shows an example representation of an example interface for media content playback by a group of playback devices.
Figure 11B:
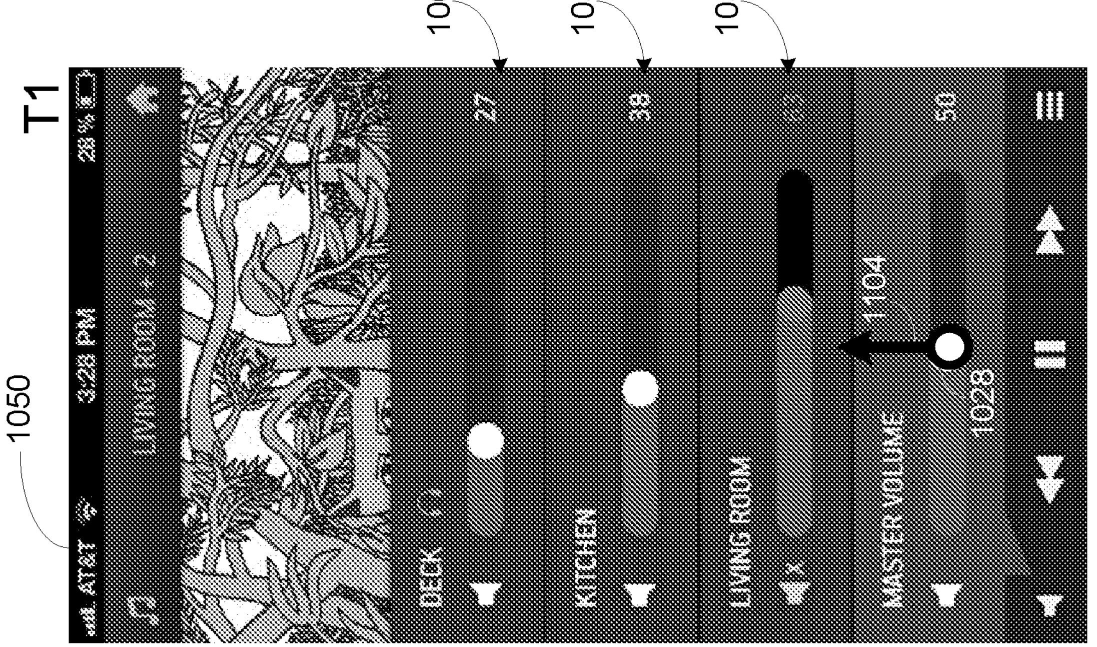
FIG. 11B shows an example representation of a third example interface for volume control of a group of playback devices.
Figure 11A:
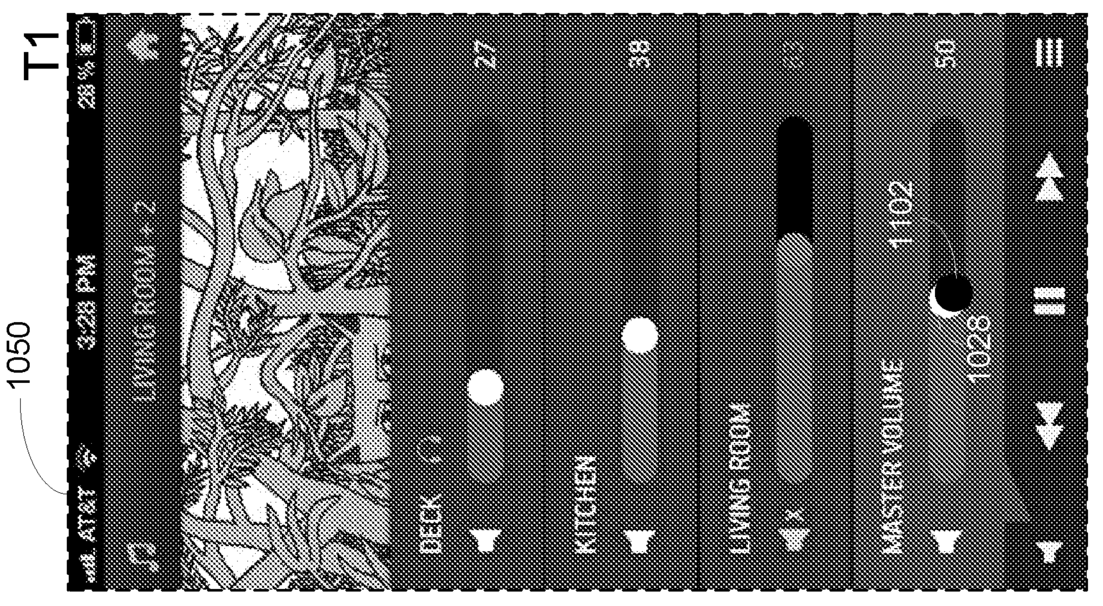
FIG. 11A shows an example representation of a second example interface for volume control of a group of playback devices.
Figure 12:
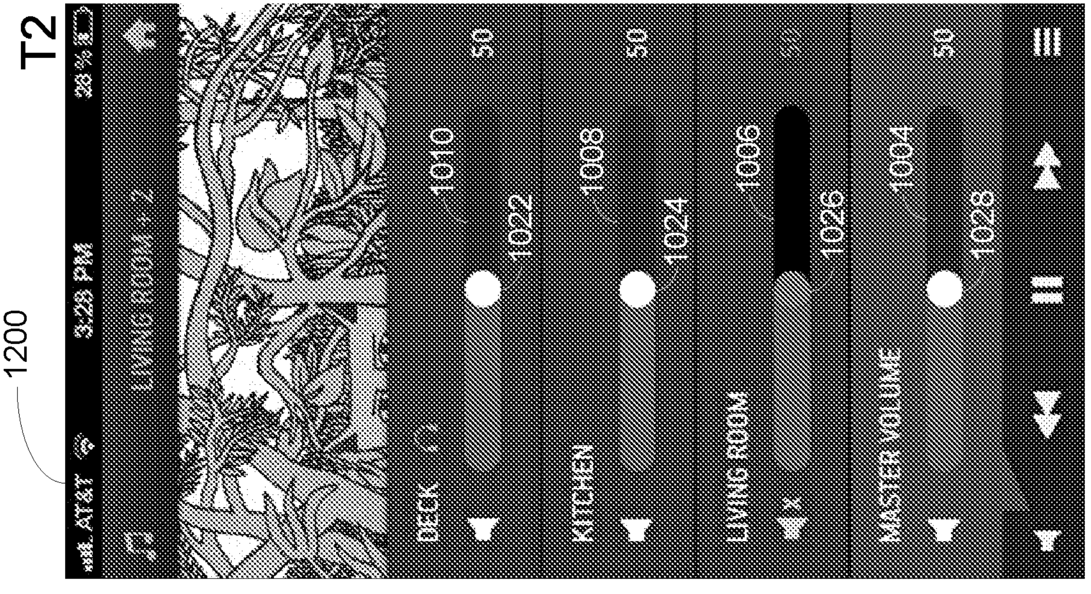
FIG. 12 shows an example representation of a fifth example interface for volume control of a group of playback devices.
Figure 11C:
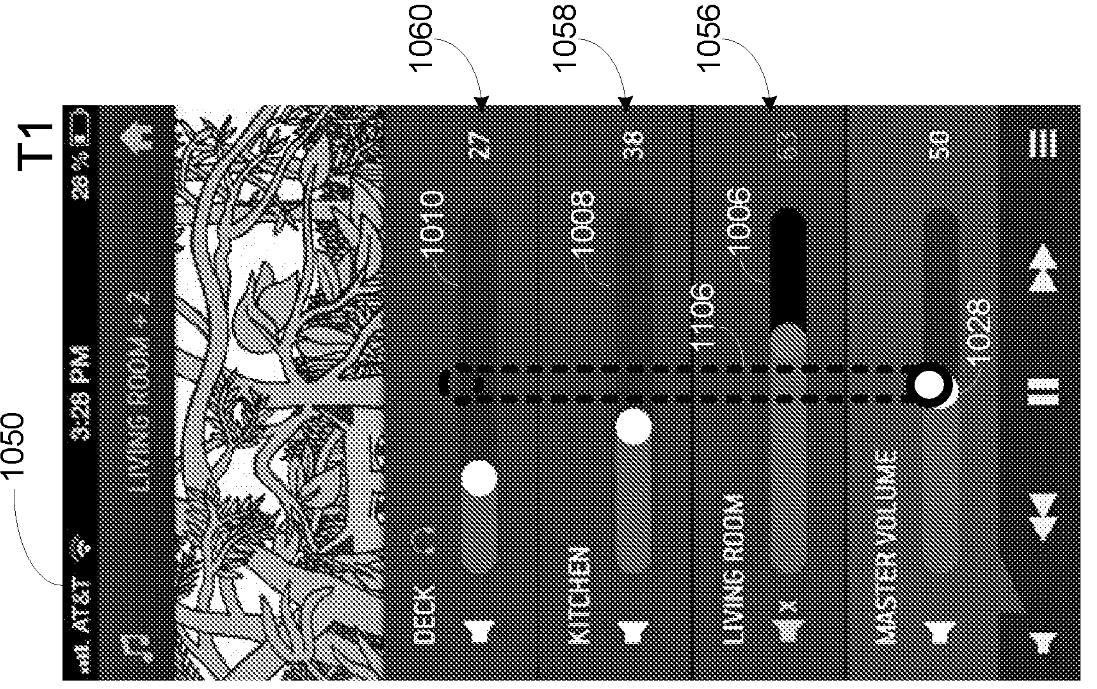
FIG. 11C shows an example representation of a fourth example interface for volume control of a group of playback devices.

FIGS. 10A and 10B, FIGS. 11A, 11B, and 11C, and FIG. 12 show a series of example user interfaces for media content playback and volume control by a network media system such as those described above. As will be discussed in the following, FIG. 10A shows an example user interface 1000 for media content playback by a group of playback devices at a time TO. TO may be when the user accesses the user interface while the network media system is playing media content. From the user interface 1000, the user may access a user interface 1050 at time T1, as shown in FIG. 10B, when the user wishes to view and control playback volumes associated with groups of playback devices in the network media system. FIGS. 11A, 11B and 11C show example touch interactions with the user interface at time T1 that may cause playback volume adjustments, and FIG. 12 shows an example user interface 1200 at time T2, after the volume adjustments have been made in response to the example touch interactions at T1, shown in FIGS. 11A, 11B, and 11C.

As shown in FIG. 10A, the interface 1000 provides graphical representations of media content being played, and information associated with the media content being played. The interface 1000 may further provide a zone identifier 1020 identifying the zone or zone group playing the represented media content. In this case, the zone identifier 1020 may show "Living Room+2" to indicate that the media content is being played by a "Living Room" zone and two other zones that may be organized in a group with the Living Room zone. In some respect, the group of zone players may effectively be a zone that includes the one or more zone players from each of the zones in the group.

As indicated previously, the user may manage and control playback volumes of playback devices in the network media system via the user interface. In this case, the interface 1000 may further provide a selectable control icon 1002 that may be selected to bring up a volume control interface 1050, as shown in FIG. 10B.

Figure 9:
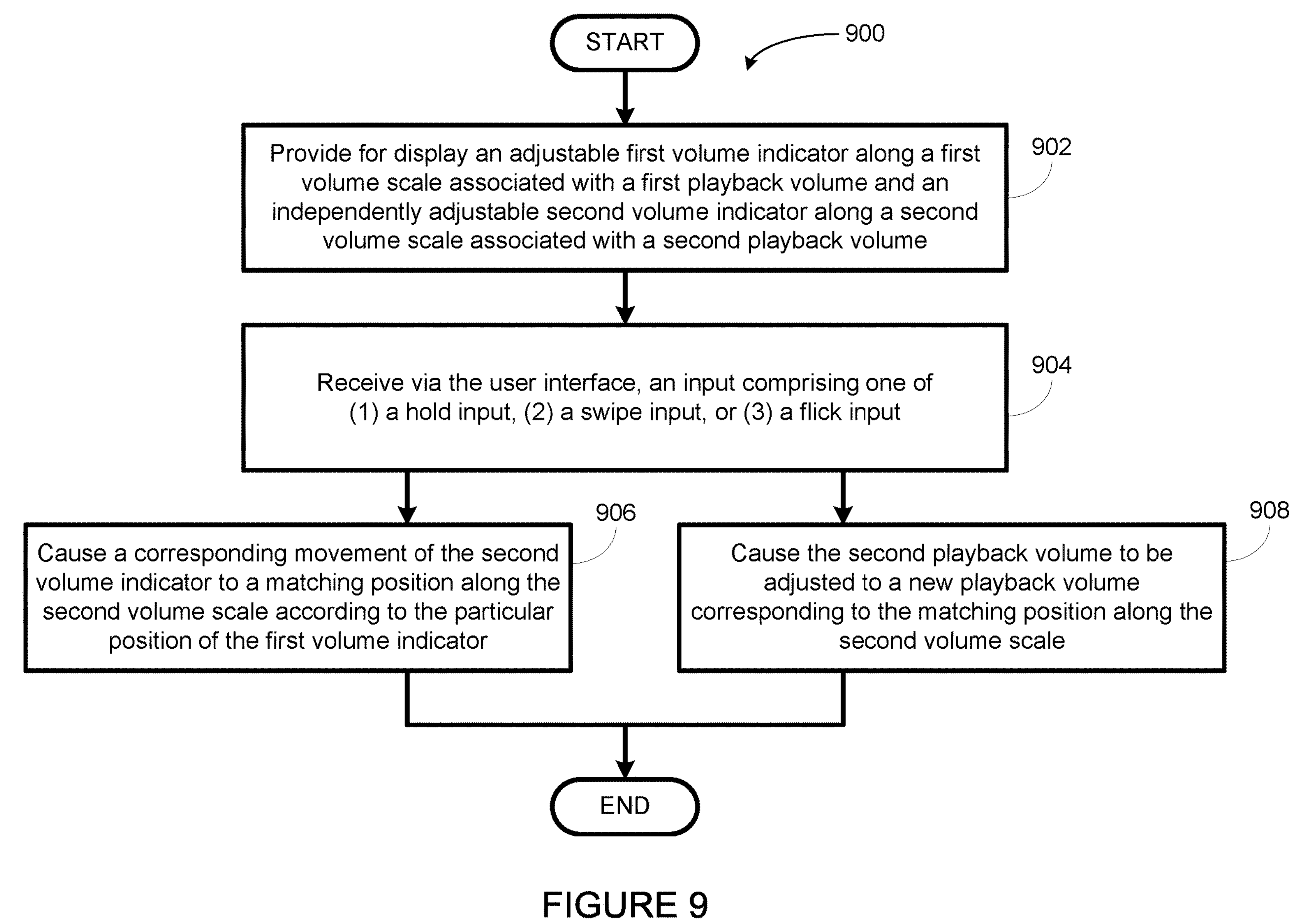
FIG. 9 shows an example flow diagram for volume control of a group of playback devices.

FIG. 9 shows an example flow diagram for volume control of a group of playback devices, in accordance with at least some embodiments described herein. Method 900 shown in FIG. 9 presents an embodiment of a method that could be used in the environments 100, 600, 700, and 800 with the systems 200, 202, 204, 300, 400, and 500 for example, in communication with one or more devices, such as those illustrated in FIGS. 2-5. Method 900 may include one or more operations, functions, or actions as illustrated by one or more of blocks 902-908. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the method 900 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 900 and other processes and methods disclosed herein, each block in FIG. 9 may represent circuitry that is wired to perform the specific logical functions in the process.

At block 902, the method 900 may involve providing for display an adjustable first volume indicator along a first volume scale associated with a first playback volume, and an independently adjustable second volume indicator along a second volume scale associated with a second playback volume. The first playback volume may be that of a first group of one or more playback devices in the network media system, and the second playback volume may be that of a second group of one or more playback devices in the network media system. In one example, the volume indicators and volume scales may be as provided on the interface 1050 of FIG. 10B.

As shown in FIG. 10B, the interface 1050 may include a Deck zone volume control region 1060, a Kitchen zone volume control region 1058, and a Living Room zone volume control region 1056. As indicated, the two other zones organized in the group with the Living Room zone as referenced above may be the "Deck" zone and the "Kitchen" zone.

The Deck zone volume control region 1060 may include a Deck volume scale 1010 and a Deck volume indicator 1022 along the Deck volume scale 1010. Similarly, the Kitchen zone volume control region 1058 may include a Kitchen volume scale 1008 and a Kitchen volume indicator 1024 along the Kitchen volume scale 1008, and the Living Room zone region 1056 may include a Living Room volume scale 1006 and a Living Room volume indicator 1026 along the Living Room volume scale 1006.

Each of the volume indicators 1022, 1024, and 1026 represent a playback volume level of the respective playback zones along normalized volume scales 1010, 1008, and 1006. As noted previously, each playback zone may have different numbers of playback devices and different types of playback devices. As such, actual playback volume outputs (measurable in decibels) may vary from zone to zone, even if the playback volumes are shown to be substantially the same along normalized volume scales.

As shown, the Deck zone volume control region also includes a headphone icon 1014 indicating that playback of media content in the Deck zone may be through one or more headphones rather than speakers of playback devices in the Deck zone. Also shown, the Living Room volume control region includes a mute icon indicating that output from playback devices in the Living Room zone may be currently muted. In this case, the Living Room volume indicator 1026 may represent a volume level that playback devices in the Living Room zone may playback media content when playback in the Living Room zone is unmuted. Also as shown, Living Room volume indicator 1026 may be colored differently from indicators 1022, 1024, and 1028 to indicate that the Living Room zone is currently muted.

The interface 1050 shown in FIG. 10B also includes a "Master Volume" control region 1054 with a Master Volume scale 1004, and a Master Volume indicator 1028 along the Master Volume scale 1004. In this example, the Master Volume indicator 1028 may represent the group volume level of the "Living Room+2" group of zones along the Master volume scale 1004, which may be normalized along with volume scales 1006, 1008, and 1010.

In some cases, the group volume may represent a combination of playback volumes of the different playback zones in the group. For instance, the group volume as indicated by the Master Volume indicator 1028 may be based on an average of playback zone volumes as indicated by volume indicators 1022, 1024, and 1026. In another instance, the Master Volume indicator 1028 may be based on an average of playback volumes for each of the one or more playback device in the playback zones of the group. As yet another example, Master Volume indicator 1028 may be shown to reflect the volume of the highest of the indicators 1022-1026. Other examples are possible as well.

Referring back to block 902 of the method 900, the first and second volume scales may refer to any two the volume scales 1004, 1006, 1008, or 1010. In one instance, the first volume scale may refer to the Deck volume scale 1010, and the second volume scale may refer to the Kitchen volume scale 1008. In another instance, the first volume scale may refer to the Master Volume scale, and the second volume scale may refer to the Living Room volume scale. In this instance, the first group of one or more playback devices may include the second group of one or more playback devices. For purposes of illustration, embodiments discussed hereafter may generally involve an instance where the first volume scale refers to the Master Volume scale 1004, and the second volume scale refers to any one or more of the Living Room volume scale 1006, Kitchen volume scale 1008, and Deck volume scale 1010. Nevertheless, other configurations are also possible.

Further, as shown and suggested above, additional volume indicators along respective additional volume scales associated with additional playback volumes may also be provided on the interface, as shown in FIG. 10B. For instance, an independently adjustable third volume indicator along a third volume scale associated with a third playback volume may be provided. In this instance, the third playback volume may be that of a third group of one or more playback devices. In one case, the first group of one or more playback devices may include both the second and third group of one or more playback devices. Accordingly, any features and interactions discussed herein relating to the first and second playback volumes (and associated volume indicators and volume scales provided on the interface) may similarly be applied to the third or any additional playback volumes.

At block 904, the method 900 may involve receiving via the user interface, an input comprising one of a hold input, a swipe input, or a flick input. Each of the hold, swipe, and flick inputs may involve an engagement with a particular input area on the user interface corresponding to a particular position of the first volume indicator along the first volume scale. In one example, the particular input area may be substantially on the particular position of the first volume indicator displayed on the user interface. As suggested above, the input may be configured to cause the first playback volume to be applied to one or more other playback zones in the network media system such that the volume level on the respective normalized volume scale for each of the one or more other playback zones matches that of the first playback volume on the normalized first volume scale.

The hold input may involve a substantially stationary touch engagement on the user interface. As such, the input may include a hold input on the particular input area on the user interface corresponding to the particular position of the first volume indicator along the first volume scale. In one case, the hold input may involve the substantially stationary touch engagement being sustained for a given duration. For instance, the given duration may be in the range of 5 to 15 milliseconds. FIG. 11A shows the interface 1050 at time T1 with a hold input 1102 substantially on the Master Volume indicator 1028, such that the group volume as indicated by the position of the Master Volume indicator 1028 along the Master Volume scale 1004 may be applied to the playback zones in the "Living Room+2" group.

The flick input may involve a directional disengagement from the user interface. As such, the input may include a flick input starting from the particular input area on the user interface towards areas on the interface where volume control regions for playback zones in the group may be provided. FIG. 11B shows the interface 1050 at time T1 with a flick input 1104 disengaging from the Master Volume indicator 1028 in the direction of the Deck zone volume control region 1060, the Kitchen zone volume control region 1058, and the Living Room zone volume control region 1056. As such, the group volume as indicated by the position of the Master Volume indicator 1028 along the Master Volume scale 1004 may be applied to the playback zones in the "Living Room+2" group.

The swipe input may involve a continuous engagement between to areas on the user interface. As such, the input may include a swipe input starting from the particular input area on the user interface and traversing areas on the interface where volume control regions for playback zones in the group are provided. FIG. 11C shows the interface 1050 at time T1 with a swipe input 1106 starting substantially from the Master Volume indicator 1028 and traversing the Living Room volume scale 1006 in the Living Room zone volume control region 1056, the Kitchen volume scale 1008 in the Kitchen zone volume control region 1058, and the Deck volume scale 1010 in the Deck zone volume control region 1060. As such, the group volume as indicated by the position of the Master Volume indicator 1028 along the Master Volume scale 1004 may be applied to the playback zones in the "Living Room+2" group.

In some cases, the input may include a single interaction with the user interface such as the hold, swipe, or flick inputs described. In some other cases, the input may include a series of interactions with the user interface. In one case, the input involving the engagement with a particular input area on the user interface corresponding to a particular position of the first volume indicator along the first volume scale may further include an initial input to move the first volume indicator to the particular position. In other words, the first playback volume may be adjusted immediately prior to being applied to the one or more other playback zones in the network media system.

In one example, the initial input may involve an initial swipe input indicating continuous engagement between an initial input area on the user interface substantially corresponding to an initial position of the first volume indicator along the first volume scale and the particular input area on the user interface. In this case, the initial position of the first volume indicator may correspond to an initial playback volume of the first group of one or more playback devices in the network media system. As such, the initial swipe input between the initial input area and the particular input area may cause a movement of the first volume indicator from the initial position to the particular position along the first volume scale, and correspondingly cause the initial playback volume of the first group of one or more playback devices to be adjusted to the first playback volume of the first group of one or more playback devices.

Referring back to FIG. 10B, a swipe input 1016 may have been provided on the interface 1050 to move the Master Volume indicator 1028 along the Master Volume scale 1004 from an initial position to a new, desired position to adjust the group volume level of the "Living Room+2" group, prior to the inputs shown in FIGS. 11A-C to apply the group volume to the other playback zones in the group. As shown in FIG. 10B, the group volume may have been adjusted from around 30 out of 100 to a new, desired group volume level of 50. In this case, corresponding volume adjustments may have also been made to the playback volume levels for the Deck zone, Kitchen zone, and Living Room zone. For instance, the playback volume level for the Living Room zone may have been accordingly adjusted from around 43 out of 100 to 63, in response to the adjustment of the group volume level.

In addition to the swipe input 1016 as shown in FIG. 10B, other inputs such as tap or double tap inputs involving brief engagements with the particular input area on the user interface may accordingly cause the first volume indicator to move and the playback volume of the first group of playback devices to be adjusted. In addition to the Master Volume indicator 1028, each of the volume indicators 1022, 1024, and 1026 may also be individually moved via the touch screen along the volume scales 1010, 1008, and 1006 to adjust playback volumes for the Deck zone, Kitchen zone, and Living Room zone, respectively in a similar manner. As suggested above, the Master Volume indicator 1028 may be accordingly adjusted in response to volume adjustments to the Deck zone, Kitchen zone, and Living Room zone if the group volume changes as a result of the adjustments to the Deck zone, Kitchen zone, and/or Living Room zone.

As mentioned above, the input may be configured to cause the first playback volume to be applied to one or more other playback zones in the network media system such that the volume level on the respective normalized volume scale for each of the one or more other playback zones matches that of the first playback volume on the normalized first volume scale. Accordingly, the corresponding volume indicator for each of the one or more playback zones may be also moved to the same, or substantially the same desired position along corresponding volume scales as the first volume indicator.

In response to receiving the input at block 904, block 906 of the method 900 may involve causing a corresponding movement of the second volume indicator to a matching position along the second volume scale according to the particular position of the first volume indicator. In one case, the matching position along the second volume scale may be substantially the same as the particular position along the first volume scale. In other words, the first and second volume indicators may be at substantially the same position along the first and second normalized volume scales, respectively. FIG. 12 shows the example user interface 1200 at time T2, after the volume adjustments have been made in response to the example touch interactions at T1, shown in FIGS. 11A, 11B, and 11C. In this case, the group volume as indicated by the Master Volume indicator 1028 along the Master Volume scale has been applied to the playback zones in the "Living Room+2" group. As shown, the Living Room volume indicator 1026, the Kitchen volume indicator 1024, and the Deck volume indicator 1022 are each in the same, or substantially the same position along the respective volume scales as the Master Volume indicator 1028 is along the Master Volume scale 1004, i.e. 50 out of 100.

Also in response to receiving the input at block 904, block 908 of the method 900 may involve causing the second playback volume of the second group of one or more playback devices to be adjusted to a new playback volume corresponding to the matching position along the second volume scale. Analogous to how the matching position along the second volume scale may be substantially the same as the particular position along the first volume scale, the new playback volume of the second group of one or more playback devices may be substantially the same as the first playback volume of the first group of one or more playback devices. As indicated previously, actual playback volume outputs (measurable in decibels) may vary from zone to zone, even if the playback volumes are shown to be substantially the same along normalized volume scales.

In embodiments described herein, playback volumes may correspond to respective volume indicators along respective volume scales and vice versa. While blocks 906 and 908 of the method 900 may involve adjusting playback volumes according to movements of corresponding volume indicators, other embodiments may also be possible. For instance, the input received at block 904 may cause the first playback volume to be applied to the second group of one or more playback devices, and the second volume indicator may be moved along the second volume scale according to the new playback volume of the second group of one or more playback devices.

In one example, the method 900 may further involve causing the first group of one or more playback devices to render a first media content at the first playback volume, and causing the second group of one or more playback devices to render a second media content at the new playback volume. As indicated above, the new playback volume may be the same, or substantially the same as the second playback volume.

In one case, causing the first group of one or more playback devices to render the first media content at the first playback volume may involve sending to at least one playback device in the first group of one or more playback devices data indicating the first playback volume. In some instances, the data indicating the first playback volume may only be sent in response to a change in the playback volume of the first group of one or more playback devices (i.e. from the initial playback volume to the first playback volume). In one case, the data indicating the first playback volume may be sent to a single playback device in the zone, and the single playback device may subsequently communicate the first playback volume to other playback devices in the zone. In another case, a subset of playback devices in the zone may receive the data, and subsequently communicate the new playback volume to the remaining playback devices. In yet another case, each of the playback devices in the zone may receive the data indicating the new playback volume.

Analogously, causing the second group of one or more playback devices to render the second media content at the new playback volume may involve sending to at least one playback device in the second group of one or more playback devices data indicating the second playback volume. Similar to the case of the first playback volume, the data indicating the new playback volume may be provided to the playback devices in the second group through a single playback device in the second group, a subset of playback devices in the second group, or directly to each playback device in the second group.

As discussed in the examples above, the first and second groups of playback devices in the network media system may be playing media content in synchrony. As such, in one example, the first media content rendered by the first group of playback devices may be the same as the second media content rendered by the second group of playback devices.

Further, in some embodiments, the network media system may be configured such that the new volume levels for the groups of playback devices may be applicable to specific corresponding playback configurations. Referring back to the examples discussed above in connection to FIG. 10A-12, the applied volume level of 50 out of 100 for each zone in the "Living Room+2" group may be specifically associated with the "Living Room+2" configuration. Accordingly, in some embodiments, a different volume level for a playback zone or individual playback device may be saved and reverted to at a later time for any combination of playback zones or playback devices that includes the playback zone or individual playback device. Other example configurations and embodiments may also be possible.

For instance, the original Kitchen zone volume level of 38 out of 100 may be saved when the group volume level is applied to the Kitchen zone. As such, if and when the "Living Room+2" group becomes inactive such that the Deck zone, Kitchen zone, and Living Room zone are no longer organized in a group, the Kitchen zone volume level may revert back to being 38 out of 100. Subsequently, if the Deck zone, Kitchen zone, and Living Room zone are once again organized together as the "Living Room+2" group, the zone volume level for the Kitchen zone (as well as the Deck zone and the Living Room zone) may be adjusted to be 50 out of 100, or whatever the applied group volume was when the group previously became inactive.

In addition, one having ordinary skill in the art will appreciate that interactions and touch inputs such as those described above may also be based on for applying volume levels from one zone to another, whether or not the zones are in a group. Referring back to FIG. 10B as an example, if a swipe input is provided starting from the substantially where the Living Room volume indicator 1026 is provided on the interface 1050 and traversing the Kitchen volume scale in the Kitchen zone volume control region 1058, the volume level of 63 out of 100 in the Living Room zone may be applied such that the volume level of the Kitchen zone is also 63, while the volume level of the Deck zone may remain at 27. In this case, the group volume level as indicated in the Master Volume control region 1054 may be updated according to the change in the volume level of the Kitchen zone. Other examples, which may involve a hold input like the hold input 1102 or a flick input like the flick input 1104 for instance, may also be possible.

IX. Conclusion

The descriptions above disclose various example systems, methods, apparatus, and articles of manufacture including, among other components, firmware and/or software executed on hardware. However, such examples are merely illustrative and should not be considered as limiting. For example, it is contemplated that any or all of these firmware, hardware, and/or software components can be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

As indicated above, the present application involves volume controls of playback devices in a network media system. In one aspect, a method is provided. The method involves providing for display on a user interface an adjustable first volume indicator along a first volume scale associated with a first playback volume of a first group of one or more playback devices, and an independently adjustable second volume indicator along a second volume scale associated with a second playback volume of a second group of one or more playback devices.

The method further involves receiving via the user interface, an input comprising one of (i) a continuous stationary touch engagement of a given duration with a particular input area on the user interface corresponding to a particular position of the first volume indicator along the first volume scale (ii) a continuous engagement beginning at a particular input area on the user interface substantially corresponding to a particular position of the first volume indicator along the first volume scale and traversing at least a second input area on the user interface corresponding to the second volume scale, and (iii) an engagement with a particular input area on the user interface substantially corresponding to a particular position of the first volume indicator along the first volume scale, and a directional disengagement from the particular input area towards at least a second input area on the user interface corresponding to the second volume scale.

The method also involves responsively, causing a corresponding movement of the second volume indicator to a matching position along the second volume scale according to the particular position of the first volume indicator, and causing the second playback volume of the second group of one or more playback devices to be adjusted to a new playback volume corresponding to the matching position along the second volume scale.

In another aspect, a device is provided. The device includes a processor and memory having stored thereon instructions executable by the processor to perform functions. The functions include providing for display on a user interface an adjustable first volume indicator along a first volume scale associated with a first playback volume of a first group of one or more playback devices, and an independently adjustable second volume indicator along a second volume scale associated with a second playback volume of a second group of one or more playback devices.

The functions further involve receiving via the user interface, an input comprising one of (i) a continuous stationary touch engagement of a given duration with a particular input area on the user interface corresponding to a particular position of the first volume indicator along the first volume scale (ii) a continuous engagement beginning at a particular input area on the user interface substantially corresponding to a particular position of the first volume indicator along the first volume scale and traversing at least a second input area on the user interface corresponding to the second volume scale, and (iii) an engagement with a particular input area on the user interface substantially corresponding to a particular position of the first volume indicator along the first volume scale, and a directional disengagement from the particular input area towards at least a second input area on the user interface corresponding to the second volume scale.

The functions also involve responsively, causing a corresponding movement of the second volume indicator to a matching position along the second volume scale according to the particular position of the first volume indicator, and causing the second playback volume of the second group of one or more playback devices to be adjusted to a new playback volume corresponding to the matching position along the second volume scale.

In yet another aspect, a non-transitory computer readable memory is provided. The non-transitory computer readable memory has stored thereon instructions executable by a computing device to cause the computing device to perform functions. The functions include providing for display on a user interface an adjustable first volume indicator along a first volume scale associated with a first playback volume of a first group of one or more playback devices, and an independently adjustable second volume indicator along a second volume scale associated with a second playback volume of a second group of one or more playback devices.

The functions further involve receiving via the user interface, an input comprising one of (i) a continuous stationary touch engagement of a given duration with a particular input area on the user interface corresponding to a particular position of the first volume indicator along the first volume scale (ii) a continuous engagement beginning at a particular input area on the user interface substantially corresponding to a particular position of the first volume indicator along the first volume scale and traversing at least a second input area on the user interface corresponding to the second volume scale, and (iii) an engagement with a particular input area on the user interface substantially corresponding to a particular position of the first volume indicator along the first volume scale, and a directional disengagement from the particular input area towards at least a second input area on the user interface corresponding to the second volume scale.

The functions also involve responsively, causing a corresponding movement of the second volume indicator to a matching position along the second volume scale according to the particular position of the first volume indicator, and causing the second playback volume of the second group of one or more playback devices to be adjusted to a new playback volume corresponding to the matching position along the second volume scale.

Additionally, references herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

The invention claimed is:

1. A tangible, non-transitory computer-readable medium having instructions stored thereon that, when executed by one or more processors of a computing device, cause the computing device to perform functions comprising:

displaying, via a controller interface, a first volume control configured to control the volume of a first playback device, wherein the first volume control comprises a volume indicator on a first volume slider;

displaying, via the controller interface, a second volume control configured to control the volume of a headphone, wherein the second volume control comprises a volume indicator on a second volume slider;

after displaying the first volume control and after reception of an input to form a synchrony group between the first playback device and the headphone, causing the first playback device to form the synchrony group with the headphone and the first playback device to become muted; and after forming the synchrony group, displaying, via the controller interface, a group volume control configured to control volume of the synchrony group, wherein while the first playback device is muted, the group volume control is configured to indicate and control only the volume of the headphone.

2. The tangible, non-transitory computer-readable medium of claim 1, wherein the tangible, non-transitory computer-readable medium further comprises instructions stored thereon that, when executed by the one or more processors of the computing device, cause the computing device to perform functions comprising:

displaying, via the controller interface, a mute control indicating that the first playback device is muted; and receiving, via the mute control, an input to unmute the first playback device.

3. The tangible, non-transitory computer-readable medium of claim 1, wherein while the first playback device is muted, the group volume control is configured to indicate and control only the volume of the headphone comprises the group volume control indicates a volume level at a first volume level.

4. The tangible, non-transitory computer-readable medium of claim 3, wherein the tangible, non-transitory computer-readable medium further comprises instructions stored thereon that, when executed by the one or more processors of the computing device, cause the computing device to perform functions comprising:

displaying, via the controller interface, a mute control indicating that the first playback device is muted;

receiving, via the mute control, an input to unmute the first playback device; and after receiving the input to unmute the first playback device, updating the group volume control from indicating the first volume level to indicating a second volume level.

5. The tangible, non-transitory computer-readable medium of claim 1, wherein the tangible, non-transitory computer-readable medium further comprises instructions stored thereon that, when executed by the one or more processors of the computing device, cause the computing device to perform functions comprising:

after forming the synchrony group, displaying, via the controller interface, a representation of the first playback device and the headphone in the synchrony group and a headphone icon associated with the headphone.

6. The tangible, non-transitory computer-readable medium of claim 1, wherein the tangible, non-transitory computer-readable medium further comprises instructions stored thereon that, when executed by the one or more processors of the computing device, cause the computing device to perform functions comprising:

after forming the synchrony group, displaying concurrently, via the control interface, the group volume control and a headphone icon associated with the headphone.

7. The tangible, non-transitory computer-readable medium of claim 1, wherein the tangible, non-transitory computer-readable medium further comprises instructions stored thereon that, when executed by the one or more processors of the computing device, cause the computing device to perform functions comprising:

receiving, via the group volume control, an input to modify a volume setting of the synchrony group; and based on receiving the input to modify the volume setting of the synchrony group from a first level to a second level, transmitting, to the first playback device, a message indicating the volume setting modification.

8. The tangible, non-transitory computer-readable medium of claim 1, wherein the tangible, non-transitory computer-readable medium further comprises instructions stored thereon that, when executed by the one or more processors of the computing device, cause the computing device to perform functions comprising:

receiving a state variable indicating that the first playback device and the headphone are in the synchrony group; and based on the received state variable, displaying, via the controller interface, an indication that the first playback device and the headphone are in the synchrony group.

9. A computing device comprising:

at least one processor; and at least one tangible, non-transitory computer-readable medium having instructions stored thereon that, when executed by the at least one processor of the computing device, cause the computing device to perform functions comprising:

displaying, via a controller interface, a first volume control configured to control the volume of a first playback device, wherein the first volume control comprises a volume indicator on a first volume slider;

displaying, via the controller interface, a second volume control configured to control the volume of a headphone, wherein the second volume control comprises a volume indicator on a second volume slider;

after displaying the first volume control and after reception of an input to form a synchrony group between the first playback device and the headphone, causing the first playback device to form the synchrony group with the headphone and the first playback device to become muted; and after forming the synchrony group, displaying, via the controller interface, a group volume control configured to control volume of the synchrony group, wherein while the first playback device is muted, the group volume control is configured to indicate and control only the volume of the headphone.

10. The computing device of claim 9, wherein the tangible, non-transitory computer-readable medium further comprises instructions stored thereon that, when executed by the at least one processor of the computing device, cause the computing device to perform functions comprising:

displaying, via the controller interface, a mute control indicating that the first playback device is muted; and receiving, via the mute control, an input to unmute the first playback device.

11. The computing device of claim 9, wherein while the first playback device is muted, the group volume control is configured to indicate and control only the volume of the headphone comprises the group volume control indicates a volume level at a first volume level.

12. The computing device of claim 11, wherein the tangible, non-transitory computer-readable medium further comprises instructions stored thereon that, when executed by the at least one processor of the computing device, cause the computing device to perform functions comprising:

displaying, via the controller interface, a mute control indicating that the first playback device is muted;

receiving, via the mute control, an input to unmute the first playback device; and after receiving the input to unmute the first playback device, updating the group volume control from indicating the first volume level to indicating a second volume level.

13. The computing device of claim 9, wherein the tangible, non-transitory computer-readable medium further comprises instructions stored thereon that, when executed by the at least one processor of the computing device, cause the computing device to perform functions comprising:

after forming the synchrony group, displaying, via the controller interface, a representation of the first playback device and the headphone in the synchrony group and a headphone icon associated with the headphone.

14. The computing device of claim 9, wherein the tangible, non-transitory computer-readable medium further comprises instructions stored thereon that, when executed by the at least one processor of the computing device, cause the computing device to perform functions comprising:

after forming the synchrony group, displaying concurrently, via the control interface, the group volume control and a headphone icon associated with the headphone.

15. The computing device of claim 9, wherein the tangible, non-transitory computer-readable medium further comprises instructions stored thereon that, when executed by the at least one processor of the computing device, cause the computing device to perform functions comprising:

receiving, via the group volume control, an input to modify a volume setting of the synchrony group; and based on receiving the input to modify the volume setting of the synchrony group from a first level to a second level, transmitting, to the first playback device, a message indicating the volume setting modification.

16. A method comprising:

displaying, via a controller interface, a first volume control configured to control the volume of a first playback device, wherein the first volume control comprises a volume indicator on a first volume slider;

displaying, via the controller interface, a second volume control configured to control the volume of a headphone, wherein the second volume control comprises a volume indicator on a second volume slider;

after displaying the first volume control and after reception of an input to form a synchrony group between the first playback device and the headphone, causing the first playback device to form the synchrony group with the headphone and the first playback device to become muted; and after forming the synchrony group, displaying, via the controller interface, a group volume control configured to control volume of the synchrony group, wherein while the first playback device is muted, the group volume control is configured to indicate and control only the volume of the headphone.

17. The method of claim 16, further comprising:

displaying, via the controller interface, a mute control indicating that the first playback device is muted; and receiving, via the mute control, an input to unmute the first playback device.

18. The method of claim 16, wherein while the first playback device is muted, the group volume control is configured to indicate and control only the volume of the headphone comprises the group volume control indicates a volume level at a first volume level.

19. The method of claim 18, further comprising:

displaying, via the controller interface, a mute control indicating that the first playback device is muted;

receiving, via the mute control, an input to unmute the first playback device; and after receiving the input to unmute the first playback device, updating the group volume control from indicating the first volume level to indicating a second volume level.

20. The method of claim 16, further comprising:

after forming the synchrony group, displaying, via the controller interface, a representation of the first playback device and the headphone in the synchrony group and a headphone icon associated with the headphone.

* * * * *